(12) United States Patent
Yamada et al.

(10) Patent No.: US 7,160,123 B2
(45) Date of Patent: Jan. 9, 2007

(54) PLURAL LAYER ANISOTROPIC CONDUCTIVE CONNECTOR AND ITS PRODUCTION METHOD

(75) Inventors: Daisuke Yamada, Hidaka (JP); Kazuaki Mayumi, Hidaka (JP); Kiyoshi Kimura, Hidaka (JP)

(73) Assignee: JSR Corporation, Tokyo (JP)

(*) Notice: Subject to any disclaimer, the term of this patent is extended or adjusted under 35 U.S.C. 154(b) by 0 days.

(21) Appl. No.: 10/504,421

(22) PCT Filed: Feb. 27, 2003

(86) PCT No.: PCT/JP03/02205

§ 371 (c)(1),
(2), (4) Date: Aug. 13, 2004

(87) PCT Pub. No.: WO03/075408

PCT Pub. Date: Sep. 12, 2003

(65) Prior Publication Data

US 2005/0106907 A1 May 19, 2005

(30) Foreign Application Priority Data

Mar. 7, 2002 (JP) ............................. 2002-062666
May 27, 2002 (JP) ............................. 2002-152316

(51) Int. Cl.
*H01R 12/00* (2006.01)
(52) U.S. Cl. ...................... 439/91; 264/108; 439/923
(58) Field of Classification Search ............. 439/91; 264/108, 437
See application file for complete search history.

(56) References Cited

U.S. PATENT DOCUMENTS 4,408,814 A * 10/1983 Takashi et al. ............... 439/91

(Continued)

FOREIGN PATENT DOCUMENTS

| JP | 6-215633 | 8/1994 |
| JP | 7-30019 | 1/1995 |
| JP | 7-73067 | 8/1995 |

(Continued)

OTHER PUBLICATIONS

U.S. Appl. No. 10/552,995, filed Oct. 13, 2005, Sato et al.

(Continued)

*Primary Examiner*—Neil Abrams
(74) *Attorney, Agent, or Firm*—Oblon, Spivak, McClelland, Maier & Neustadt, P.C.

(57) ABSTRACT

An anisotropically conductive connector, not causing permanent deformation by contact of target electrodes to be connected with pressure and deformation by abrasion even if the target electrodes are projected, and achieving stable conductivity over a long time period even when pressed repeatedly, a production process thereof, and an inspection circuit board equipped with the connector. The connector includes (1) anisotropically conductive film, with plural conductive path-forming parts each extending in a thickness-wise direction of the film arranged insulated by insulating parts and including at least 2 elastic layers, which are each formed by an insulating elastic polymeric substance, and (2) conductive particles exhibiting magnetism in portions of the respective elastic layers, at which conductive path-forming parts are formed. The connector satisfies $H_1 \geq 30$, and $H_1/H_2 \geq 1.1$, $H_1$, $H_2$ being durometer hardnesses of the elastic polymeric substance of one of elastic layers forming surfaces of the film, and of the elastic polymeric substance of the other, respectively, the resulting connector includes one harder elastic layer to limit permanent deformation and one softer layer for compliance.

18 Claims, 23 Drawing Sheets

U.S. PATENT DOCUMENTS

| | | | |
|---|---|---|---|
| 6,168,442 B1 * | 1/2001 | Naoi | 439/91 |
| 6,604,953 B1 * | 8/2003 | Igarashi et al. | 439/91 |
| 2005/0106907 A1 | 5/2005 | Yamada et al. | |

FOREIGN PATENT DOCUMENTS

| | | |
|---|---|---|
| JP | 11-40224 | 2/1999 |
| JP | 11-273772 | 10/1999 |
| JP | 2001-67942 | 3/2001 |
| JP | 2001-210402 | 8/2001 |
| JP | 3256175 | 11/2001 |
| JP | 2002-279830 | 9/2002 |

OTHER PUBLICATIONS

U.S. Appl. No. 10/548,832, filed Sep. 13, 2005, Igarashi et al.

* cited by examiner (a)

(b)

PLURAL LAYER ANISOTROPIC CONDUCTIVE CONNECTOR AND ITS PRODUCTION METHOD

TECHNICAL FIELD

The present invention relates to an anisotropically conductive connector suitable for use in, for example, inspection of circuit devices such as semiconductor integrated circuits and a production process thereof, and an inspection apparatus for circuit devices, which is equipped with this anisotropically conductive connector, and particularly to an anisotropically conductive connector suitable for use in inspection of circuit devices such as semiconductor integrated circuits having projected electrodes and a production process thereof, and an inspection apparatus for circuit devices.

BACKGROUND ART

An anisotropically conductive sheet is a sheet exhibiting conductivity only in its thickness-wise direction or having pressure-sensitive conductive conductor parts exhibiting conductivity only in the thickness-wise direction when they are pressed in the thickness-wise direction. Since the anisotropically conductive sheet has such features that compact electrical connection can be achieved without using any means such as soldering or mechanical fitting, and that soft connection is feasible with mechanical shock or strain absorbed therein, it is widely used as an anisotropically conductive connector for achieving electrical connection between circuit devices, for example, electrical connection between a printed circuit board and a leadless chip carrier, liquid crystal panel or the like, in fields of, for example, electronic computers, electronic digital clocks, electronic cameras and computer key boards.

On the other hand, in electrical inspection of circuit devices such as printed circuit boards and semiconductor integrated circuits, in order to achieve electrical connection between, for example, electrodes to be inspected formed on one surface of a circuit device, which is an inspection target, and electrodes for inspection formed on the surface of a circuit board for inspection, it is conducted to cause an anisotropically conductive sheet to intervene, as a connector, between an electrode region of the circuit device and an electrode region for inspection of the circuit board for inspection.

As such anisotropically conductive sheets, there have heretofore been known those of various structures, such as those obtained by uniformly dispersing metal particles in an elastomer (see, for example, Japanese Patent Application Laid-Open No. 93393/1976), those obtained by unevenly distributing a conductive magnetic metal in an elastomer, thereby forming a great number of conductive path-forming parts each extending in a thickness-wise direction thereof and insulating parts for mutually insulating them (see, for example, Japanese Patent Application Laid-Open No. 147772/1978) and those obtained by defining a difference in level between the surface of each conductive path-forming part and an insulating part (see, for example, Japanese Patent Application Laid-Open No. 250906/1986).

In these anisotropically conductive sheets, conductive particles are contained in an insulating elastic polymeric substance in a state oriented so as to align in the thickness-wise direction, and each conductive path is formed by a chain of a great number of conductive particles.

Such an anisotropically conductive sheet can be produced by charging a molding material with conductive particles having magnetism contained in a polymeric substance-forming material, which will become an elastic polymeric substance by, for example, curing, into a molding cavity of a mold to form a molding material layer and applying a magnetic field thereto to conduct a curing treatment.

However, the following problems are involved when a conventional anisotropically conductive sheet is used as a connector in electrical inspection of a circuit device having projected electrodes composed of, for example, a solder.

Namely, when an operation that projected electrodes that are electrodes to be inspected of a circuit device, which is an inspection target, are brought into contact under pressure with the surfaces of their corresponding conductive path-forming parts in the anisotropically conductive sheet is conducted repeatedly, permanent deformation by the contact of the projected electrodes with pressure, and deformation by abrasion occur on the surfaces of the conductive path-forming parts in the anisotropically conductive sheet, and so the electric resistance values of the conductive path-forming parts in the anisotropically conductive sheet are increased, and the electric resistance values of the respective conductive path-forming parts vary, thereby causing a problem that the following inspection of circuit devices becomes difficult.

In addition, particles with a coating layer composed of gold formed thereon are generally used as conductive particles for forming the conductive path-forming parts for the purpose of achieving good conductivity. However, an electrode material (solder) forming electrodes to be inspected in circuit devices migrates to the coating layers on the conductive particles in the anisotropically conductive sheet when electrical inspection of a great number of circuit devices is conducted continuously, whereby the coating layers are modified. As a result, a problem that the conductivity of the conductive path-forming parts is lowered arises.

In order to solve the above-described problems, it is conducted in inspection of a circuit device to form a jig for inspection of circuit devices by an anisotropically conductive sheet and a sheet-like connector obtained by arranging a plurality of metallic electrode structures each extending through in a thickness-wise direction of a flexible insulating sheet composed of a resin material in the insulating sheet and bring electrodes to be inspected into contact under pressure with the metallic electrode structures of the sheet-like connector in the jig for inspection of circuit devices, thereby achieving electrical connection with the circuit device that is an inspection target (see, for example, Japanese Patent Application Laid-Open No. 231019/1995).

In the jig for inspection of circuit devices, however, it is difficult to achieve necessary electrical connection to a circuit device, which is an inspection target, when the arrangement pitch of electrodes to be inspected of the circuit device is small, i.e., the pitch of the metallic electrode structures in the sheet-like connector is small. Specifically described, adjacent metallic electrode structures interfere with each other in the sheet-like connector small in the pitch of the metallic electrode structures, whereby the flexibility between the adjacent metallic electrode structures is lowered. Therefore, the metallic electrode structures in the sheet-like connector cannot be brought into contact with certainly with all electrodes to be inspected in a circuit device, which is an inspection target, when the circuit device is such that a surface accuracy of its substrate is low, an evenness of the thickness of the substrate is low, or variations of the height of the electrodes to be inspected is great. As a result, good electrical connection to such a circuit device cannot be achieved.

Even if it is possible to achieve a good electrically connected state to all the electrodes to be inspected, considerably great pressurizing force is required. Accordingly, the whole inspection apparatus becomes a large in scale, and the production cost of the whole inspection apparatus becomes high.

When the inspection of the circuit device is conducted under a high-temperature environment, positional deviation occurs between the conductive path-forming parts of the anisotropically conductive sheet and the metallic electrode structures of the sheet-like connector due to a difference between the coefficient of thermal expansion of the elastic polymeric substance forming the anisotropically conductive sheet and the coefficient of thermal expansion of the resin material forming the insulating sheet in the sheet-like connector. As a result, it is difficult to stably retain the good electrically connected state.

In the case where the jig for inspection of circuit devices is formed, it is necessary to produce the sheet-like connector in addition to the production of the anisotropically conductive sheet. It is also necessary to fix these members in a state aligned to each other. Therefore, the production cost of the jig for inspection becomes high.

Further, the conventional anisotropically conductive sheets involve the following problem.

Namely, the elastic polymeric substance forming the anisotropically conductive sheet, for example, silicone rubber has adhesive property at a high temperature, so that the anisotropically conductive sheet adheres to a circuit device when it is left to stand for a long period of time in a state pressurized by the circuit device under a high-temperature environment. Thereby the work of changing the circuit device after completion of the inspection to an uninspected circuit device cannot be smoothly conducted. As a result, inspection efficiency of circuit devices is lowered. When the anisotropically conductive sheet adheres to the circuit device in great strength in particular, it is difficult to separate the anisotropically conductive sheet from the circuit device without damaging it. Therefore, such an anisotropically conductive sheet cannot be used in the following inspection.

DISCLOSURE OF THE INVENTION

The present invention has been made on the basis of the foregoing circumstances and has as its first object the provision of an anisotropically conductive connector which is prevented from causing permanent deformation by the contact of the target electrodes to be connected with pressure and deformation by abrasion even if the target electrodes to be connected are those projected, and achieves stable conductivity over a long period of time even when it is pressed repeatedly.

A second object of the present invention is to provide an anisotropically conductive connector which is suitable for use in electrical inspection of circuit devices, prevented from causing permanent deformation by the contact of electrodes to be inspected in a circuit device with pressure and deformation by abrasion even if the electrodes to be inspected of the circuit device are those projected, and achieves stable conductivity over a long period of time even when it is pressed repeatedly.

A third object of the present invention is to provide an anisotropically conductive connector with which a migration of an electrode material of electrodes to be inspected to conductive particles is prevented or inhibited, achieves stable conductivity over a long period of time and can be prevented or inhibited from adhering to a circuit device even when it is used in a state brought into contact under pressure with the circuit device under a high-temperature environment, in addition to the second object.

A fourth object of the present invention is to provide a process for advantageously producing the above-described anisotropically conductive connectors.

A fifth object of the present invention is to provide an inspection apparatus for circuit devices, which is equipped with any one of the above-described anisotropically conductive connectors.

According to the present invention, there is provided an anisotropically conductive connector comprising an anisotropically conductive film, in which a plurality of conductive path-forming parts each extending in a thickness-wise direction of the film are arranged in a state mutually insulated by insulating parts, wherein the anisotropically conductive film is composed by laminating integrally at least 2 elastic layers, each formed of an insulating elastic polymeric substance and conductive particles exhibiting magnetism are contained in portions of the respective elastic layers, at which conductive path-forming parts are formed, and the anisotropically conductive film satisfies the following Condition (1) and Condition (2):

$H_1 \geq 30$                    Condition (1)

$H_1/H_2 \geq 1.1$             Condition (2)

wherein $H_1$ is a durometer hardness of an elastic polymeric substance forming one elastic layer of elastic layers forming the surfaces of the anisotropically conductive film, and $H_2$ is a durometer hardness of an elastic polymeric substance forming the other elastic layer.

The anisotropically conductive connector according to the present invention may preferably satisfy the following Condition (3):

$15 \leq H_2 \leq 55$             Condition (3)

In the anisotropically conductive connector according to the present invention, a supporting body for supporting the peripheral edge portion of the anisotropically conductive film may preferably be provided.

The anisotropically conductive connector according to the present invention may preferably be an anisotropically conductive connector for conducting electrical connection between electrodes to be inspected of a circuit device, which is an inspection target, and inspection electrodes of a circuit board for inspection by being intervened between the circuit device and the circuit board for inspection, wherein the durometer hardness of the elastic polymeric substance forming the elastic layer coming into contact with the circuit device, in the anisotropically conductive film satisfies $H_1$ in the Condition (1) and Condition (2).

In the anisotropically conductive connector, the elastic layer coming into contact with the electrodes to be inspected in the anisotropically conductive film may preferably contain particles exhibiting neither conductivity nor magnetism, and the particles exhibiting neither conductivity nor magnetism may more preferably be diamond powder.

In the anisotropically conductive connector, conductive path-forming parts, which are not electrically connected to the electrodes to be inspected of the circuit device that is an inspection target, may be formed in the anisotropically conductive film in addition to the conductive path-forming parts to be electrically connected to the electrodes to be inspected, and the conductive path-forming parts, which are not electrically connected to the electrodes to be inspected of the circuit device that is an inspection target, may be formed in at least the peripheral edge portion of the anisotropically conductive film supported by the supporting body.

In the anisotropically conductive connector, the conductive path-forming parts may be arranged at a fixed pitch.

According to the present invention, there is provided a process for producing an anisotropically conductive connector having an anisotropically conductive film, in which a plurality of conductive path-forming parts each extending in a thickness-wise direction of the film are arranged in a state mutually insulated by insulating parts, which comprises the steps of:

providing a mold for forming the anisotropically conductive film, the molding cavity of which is formed by a pair of forces, forming a molding material layer in the form of paste with conductive particles exhibiting magnetism contained in a polymeric substance-forming material on a molding surface of one force, and forming at least one molding material layer in the form of paste with conductive particles contained in a polymeric substance-forming material on a molding surface of the other force, stacking the molding material layer formed on the molding surface of said one force on the molding material layer formed on the molding surface of the other force, then applying a magnetic field having an intensity distribution to the thickness-wise directions of the respective molding material layers, and subjecting the molding material layers to a curing treatment, thereby forming the anisotropically conductive film, wherein the anisotropically conductive film satisfies the following Condition (1) and Condition (2):

$H_1 \geq 30$            Condition (1)

$H_1/H_2 \geq 1.1$          Condition (2)

wherein $H_1$ is a durometer hardness of an elastic polymeric substance obtained by curing the polymeric substance-forming material in the molding material layer formed on the molding surface of said one force, and $H_2$ is a durometer hardness of an elastic polymeric substance obtained by curing the polymeric substance-forming material in the molding material layer formed on the molding surface of the other force.

According to the present invention, there is provided an inspection apparatus for circuit devices, comprising a circuit board for inspection having inspection electrodes arranged correspondingly to electrodes to be inspected of a circuit device, which is an inspection target, and any one of the anisotropically conductive connectors described above arranged on the circuit board for inspection.

In the inspection apparatus for circuit devices according to the present invention, a pressurizing force-relaxing frame for relaxing the pressurizing force of the electrodes to be inspected against the anisotropically conductive film of the anisotropically conductive connector may preferably be arranged between the circuit device, which is an inspection target, and the anisotropically conductive connector, and the pressurizing force-relaxing frame may preferably have spring elasticity or rubber elasticity.

According to the anisotropically conductive connectors of the respective constitutions described above, the durometer hardness of the elastic polymeric substance forming one elastic layer of the elastic layers forming the surfaces of the anisotropically conductive film is at least 30, so that the anisotropically conductive connectors are prevented from causing permanent deformation by the contact of the target electrodes to be connected with pressure and deformation by abrasion even if the target electrodes to be connected are those projected. In addition, since the durometer hardness of the elastic polymeric substance forming the other elastic layer is sufficiently lower than that of the elastic polymeric substance forming said one elastic layer, necessary conductivity is surely achieved by pressurizing the conductive path-forming parts. Accordingly, stable conductivity is achieved over a long period of time even when the conductive path-forming parts are pressed repeatedly by the target electrodes to be connected.

According to the constitution that said one elastic layer contains the particles exhibiting neither conductivity nor magnetism, the hardness of said one elastic layer is increased, whereby occurrence of the permanent deformation by the contact of the target electrodes to be connected with pressure and deformation by abrasion is more inhibited, and moreover the migration of the electrode material to the conductive particles in the anisotropically conductive film is prevented or inhibited, so that more stable conductivity is achieved over a long period of time, and the anisotropically conductive connector is prevented or inhibited from adhering to a circuit device even when it is used in a state brought into contact under pressure with the circuit device under a high-temperature environment.

According to the production process of the anisotropically conductive connector, the molding material layer formed on the molding surface of one force is stacked on the molding material layer formed on the molding surface of the other force, and the respective molding material layers are subjected to a curing treatment in this state, so that an anisotropically conductive connector having a anisotropically conductive film composed of at least 2 elastic layers that are different in hardness from each other and integrally laminated can be advantageously and surely produced.

According to the inspection apparatus for circuit devices, the apparatus is equipped with the anisotropically conductive connector of the above, so that occurrence of permanent deformation by the contact of electrodes to be inspected with pressure and deformation by abrasion is inhibited even if the electrodes to be inspected are those projected, and so stable conductivity is achieved over a long period of time even when inspection is conducted continuously as to a great number of circuit devices.

Since the inspection apparatus according to the present invention is not required to use a sheet-like connector in addition to the anisotropically conductive connector, positioning between the anisotropically conductive connector and the sheet-like connector is unnecessary, so that the problem of positional deviation between the sheet-like connector and the anisotropically conductive connector due to temperature change can be avoided, and moreover the constitution of the inspection apparatus is easy.

The pressurizing force-relaxing frame is provided between a circuit device, which is an inspection target, and the anisotropically conductive connector, whereby the pressurizing force of the electrodes to be inspected against the anisotropically conductive film of the anisotropically conductive connector is relaxed, so that stable conductivity is achieved over a longer period of time.

A frame having spring elasticity or rubber elasticity is used as the pressurizing force-relaxing frame, whereby the intensity of shock applied to the anisotropically conductive film by the electrodes to be inspected can be reduced. Therefore, breaking or any other trouble of the anisotropically conductive film can be prevented or inhibited, and the circuit device can be easily separated from the anisotropically conductive film by the spring elasticity of the pressurizing force-relaxing frame when the pressurizing force against the anisotropically conductive film is released, so that the work of changing the circuit device after completion of the inspection to an uninspected circuit device can be smoothly conducted. As a result, inspection efficiency of circuit devices can be improved.

DESCRIPTION OF CHARACTERS

1 Circuit device,
2 Solder ball electrodes,
3 Circuit device for test,
5 Circuit board for inspection,
6 Inspection electrodes,
7 Thermostatic chamber,
8 Wiring,
9 Guide pins,
10 Anisotropically conductive connector,
10A Anisotropically conductive film,
10B One elastic layer,
10C The other elastic layer,
10D Intermediate elastic layer,
11 Conductive path-forming parts,
11a Projected portion,
12 Effective conductive path-forming parts,
13 Non-effective conductive path-forming parts,
15 Insulating parts,
16 Recess,
17 Through-hole,
50 Top force (mold section),
51 Ferromagnetic substance substrate,
52 Ferromagnetic substance layers,
53 Non-magnetic substance layers,
54a, 54b, 54c, 54d Spacers,
55 Bottom force (mold section), 56 Ferromagnetic substance substrate,
57 Ferromagnetic substance layers,
57a Recessed spaces,
58 Non-magnetic substance layers,
59 Molding cavity,
60 Recess,
61a First molding material layer,
61b Second molding material layer,
65 Pressurizing force-relaxing frame,
66 Opening,
67 Leaf spring part,
68 Positioning holes,
71 Supporting body,
72 Positioning holes,
73 Opening,
80B, 80C, 80D Reinforcing materials,
110 Voltmeter,
115 DC power source,
116 Constant-current controller.

BEST MODE FOR CARRYING OUT THE INVENTION

The embodiments of the present invention will hereinafter be described in details.

Figure 1:
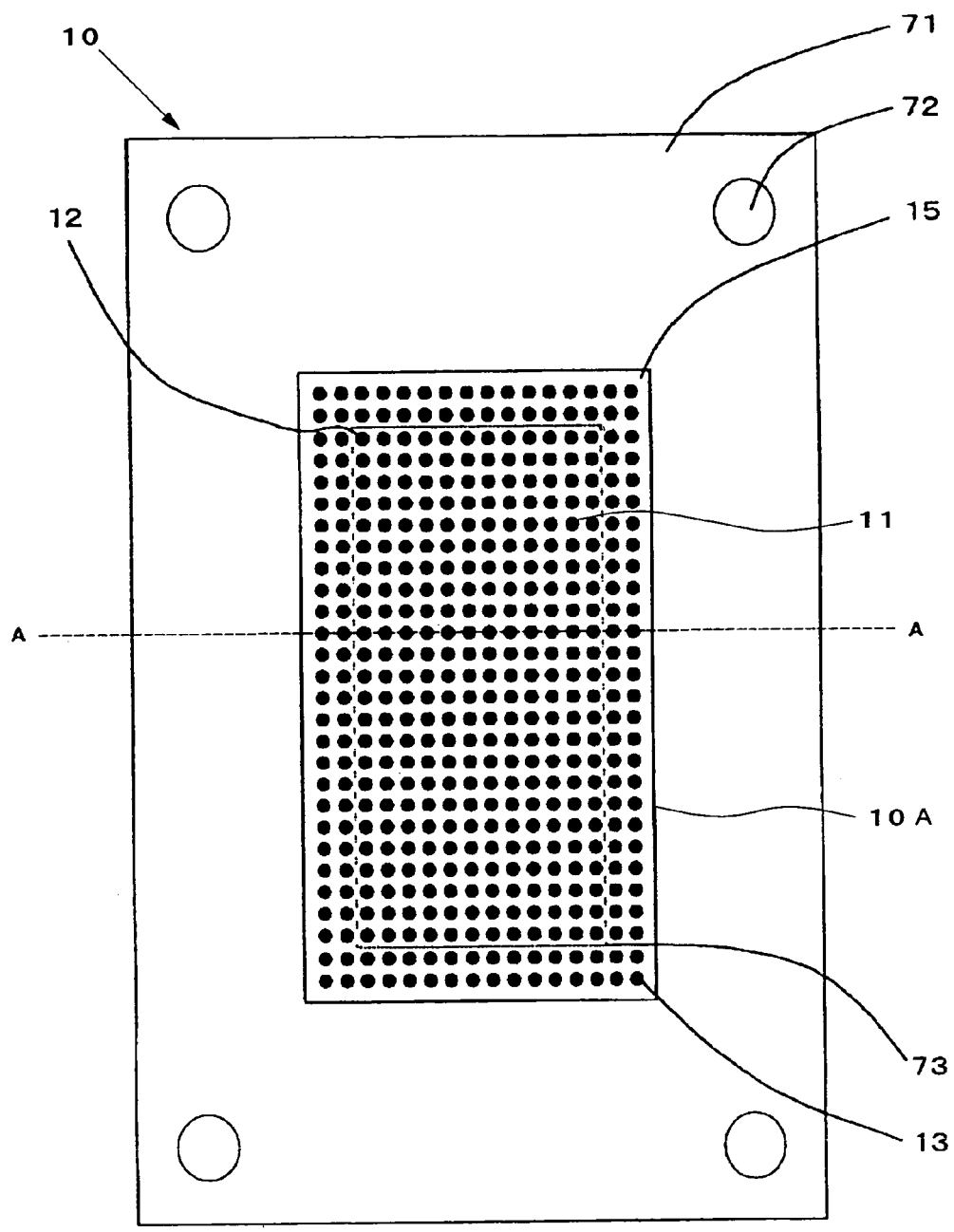
FIG. 1 is a plan view illustrating an exemplary anisotropically conductive connector according to the present invention.
Figure 2:
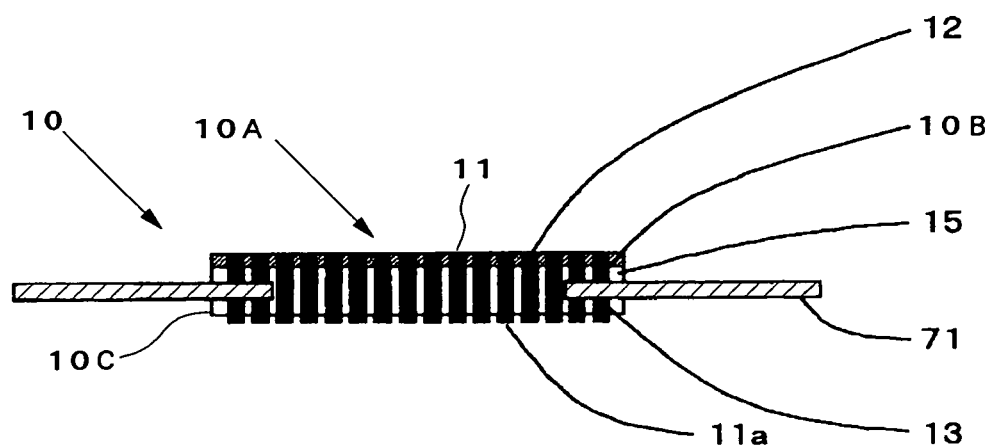
FIG. 2 is a cross-sectional view taken along line A—A of the anisotropically conductive connector shown in FIG. 1.
Figure 3:
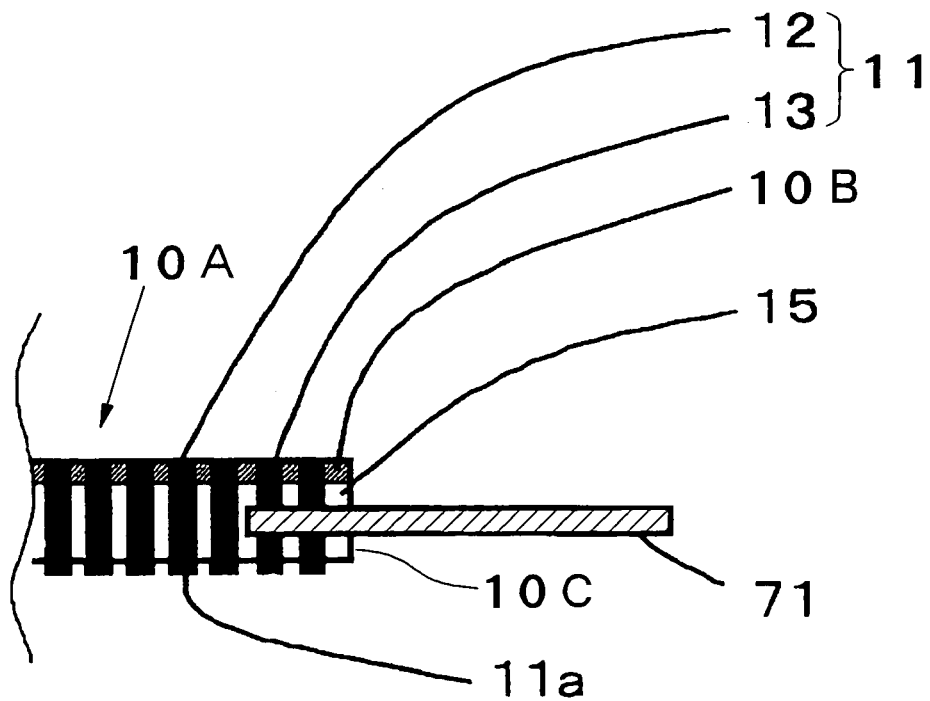
FIG. 3 is a cross-sectional view illustrating, on an enlarged scale, a part of the anisotropically conductive connector shown in FIG. 1.

FIGS. 1, 2 and 3 illustrate the construction of an exemplary anisotropically conductive connector according to the present invention, FIG. 1 is a plan view, FIG. 2 is a cross-sectional view taken along line A—A in FIG. 1, and FIG. 3 is a partially enlarged cross-sectional view. This anisotropically conductive connector 10 is composed of a rectangular anisotropically conductive film 10A and a rectangular supporting body 71 in the form of a plate for supporting the anisotropically conductive film 10A and is formed in the form of a sheet as a whole.

Figure 4:
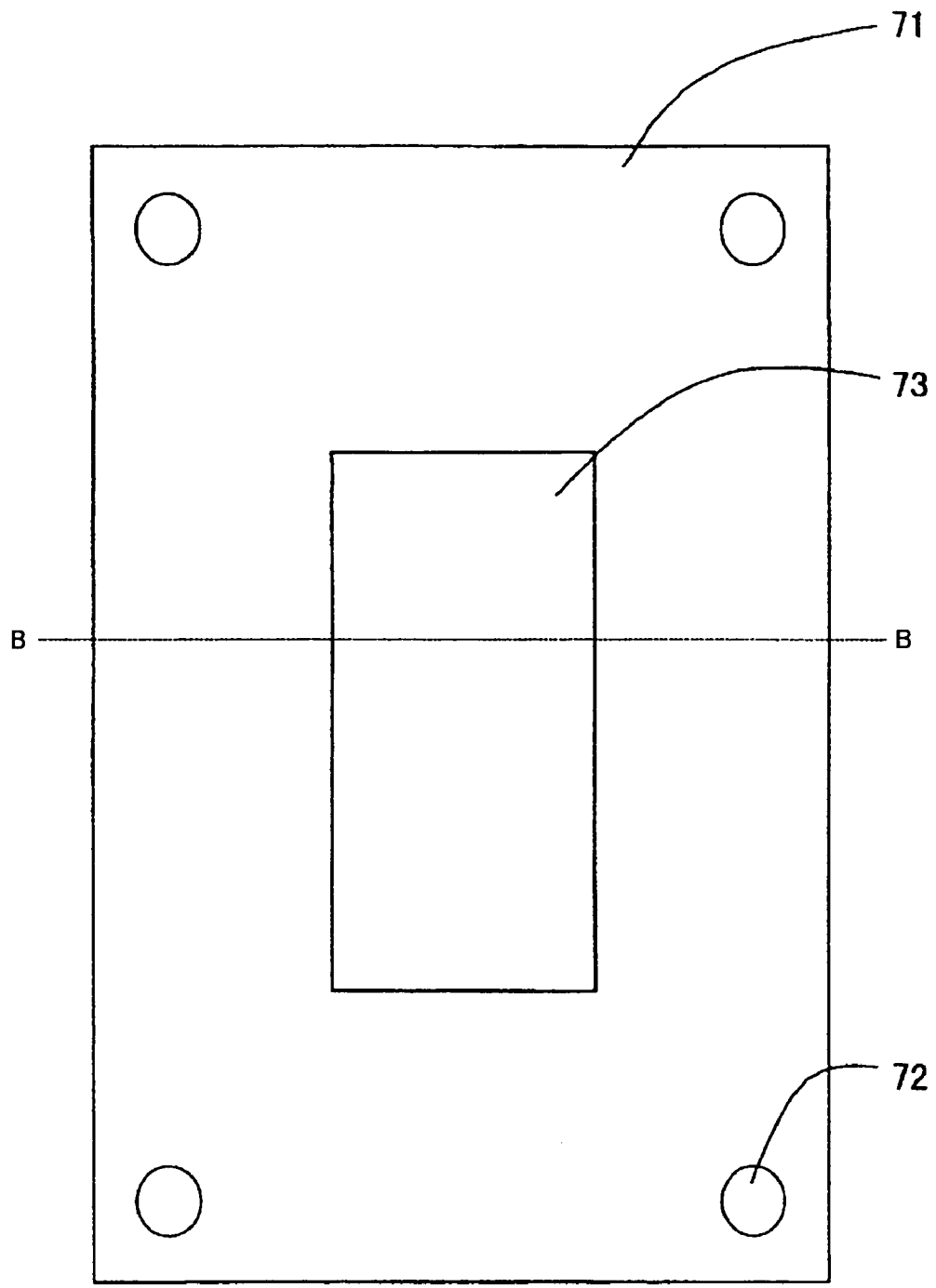
FIG. 4 is a plan view of a supporting body in the anisotropically conductive connector shown in FIG. 1.
Figure 5:
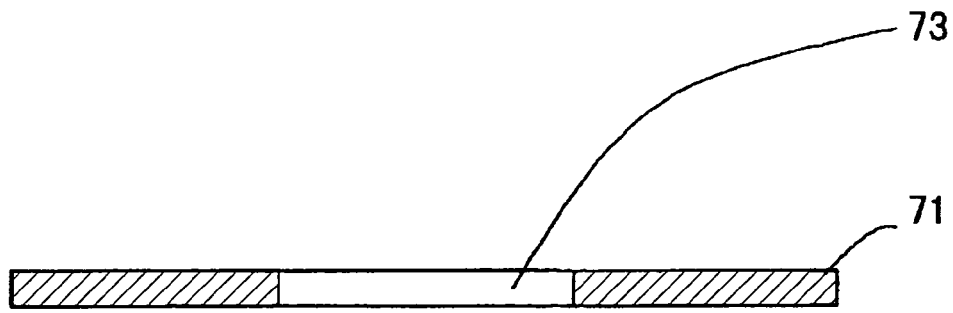
FIG. 5 is a cross-sectional view taken along line B—B of the supporting body shown in FIG. 4.

As also illustrated in FIGS. 4 and 5, a rectangular opening 73 smaller in size than the anisotropically conductive film 10A is formed at a central position of the supporting body 71, and positioning holes 72 are respectively formed at 4 corner positions. The anisotropically conductive film 10A is arranged at the opening 73 of the supporting body 71, and a peripheral edge portion of the anisotropically conductive film 10A is fixed to the supporting body 71, thereby being supported by the supporting body 71.

The anisotropically conductive film 10A in this anisotropically conductive connector 10 is composed of a plurality of columnar conductive path-forming parts 11 each extending in a thickness-wise direction thereof and insulating parts 15 composed of an insulating elastic polymeric substance for mutually insulating these conductive path-forming parts 11.

The anisotropically conductive film 10A is also composed of 2 elastic layers 10B, 10C, which are each formed by an insulating elastic polymeric substance and are integrally laminated on each other, and conductive particles (not illustrated) exhibiting magnetism are contained in portions of the respective elastic layers 10B, 10C, at which conductive path-forming parts 11 are formed.

In the embodiment illustrated, those formed in another region than the peripheral edge portion in the anisotropically conductive film 10A among the plurality of the conductive path-forming parts 11 serve as effective conductive path-forming parts 12 electrically connected to the target electrodes to be connected, for example, electrodes to be inspected in a circuit device 1, which is an inspection target, and those formed in the peripheral edge portion in the anisotropically conductive film 10A serve as non-effective conductive path-forming parts 13 not electrically connected to the target electrodes to be connected. The effective conductive path-forming parts 12 are arranged in accordance with a pattern corresponding to a pattern of the target electrodes to be connected.

On the other hand, the insulating parts 15 are integrally formed so as to surround the individual conductive path-forming parts 11, whereby all the conductive path-forming parts 11 are in a state mutually insulated by the insulating parts 15.

The surface of one elastic layer 10B of the elastic layers 10B, 10C forming the surfaces of the anisotropically conductive film 10A is flatly formed, and projected portions 11a that the surfaces of portions forming the conductive path-forming parts 11 project from the surfaces of portions forming the insulating parts 15 are formed on the other elastic layer 10C.

Particles (hereinafter referred to as "non-magnetic insulating particles") exhibiting neither magnetism nor conductivity are contained in one elastic layer 10B of the elastic layers 10B, 10C forming the surfaces of the anisotropically conductive film 10A.

The durometer hardness $H_1$ (hereinafter referred to as "hardness $H_1$") of an elastic polymeric substance forming one elastic layer 10B of the elastic layers 10B, 10C forming the surfaces of the anisotropically conductive film 10A is controlled to at least 30, preferably at least 40, and a ratio $H_1/H_2$ (hereinafter referred to as "ratio $H_1/H_2$" merely) of the hardness $H_1$ to the durometer hardness $H_2$ (hereinafter referred to as "hardness $H_2$") of an elastic polymeric substance forming the other elastic layer (elastic layer 10C in the illustrated embodiment) is controlled to at least 1.1, preferably at least 1.2, more preferably at least 1.3.

If the hardness $H_1$ is too low, the electric resistance value of each conductive path-forming part is increased in short period of time when the resulting anisotropically conductive connector is used repeatedly, so that high repetitive durability cannot be achieved.

If the ratio $H_1/H_2$ is too low, it is difficult to form conductive path-forming parts low in electric resistance value.

The hardness $H_1$ is preferably at most 70, more preferably at most 65. If the hardness $H_1$ is too high, conductive path-forming parts having high conductivity may not be obtained in some cases.

The ratio $H_1/H_2$ is preferably at most 3.5, more preferably at most 3. If the ratio $H_1/H_2$ is too high, it may be difficult in some cases to set both hardness $H_1$ and hardness $H_2$ to respective optimum values.

The hardness $H_2$ is preferably 15 to 55, more preferably 20 to 50. If the hardness $H_2$ is too low, high repetitive durability may not be achieved in some cases. If the hardness $H_2$ is too high on the other hand, conductive path-forming parts having high conductivity may not be obtained in some cases.

Supposing that the thickness of one elastic layer 10B is $\alpha$, and the thickness of the other elastic layer 10C is $\beta$, the value of a ratio $\alpha/\beta$ is preferably 0.05 to 1, more preferably 0.1 to 0.7. If the thickness of one elastic layer 10B is too great, conductive path-forming parts having high conductivity may not be obtained in some cases. If the thickness of one elastic layer 10B is too small on the other hand, high repetitive durability may not be achieved in some cases.

The elastic polymeric substances forming both elastic layers 10B, 10C in the anisotropically conductive film 10A are preferably a polymeric substance having a crosslinked structure. As curable polymeric substance-forming materials usable for obtaining such elastic polymeric substances, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block copolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber and ethylene-propylene-diene copolymer rubber.

When weather resistance is required of the resulting anisotropically conductive connector 10, any other material than conjugated diene rubbers is preferably used. In particular, silicone rubber is preferably used from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 because good heat resistance is achieved in the resulting conductive path-forming parts 11.

As the conductive particles contained in the conductive path-forming parts 11 in the anisotropically conductive film 10A, conductive particles exhibiting magnetism are used in that such particles can be easily oriented by a process, which will be described subsequently. Specific examples of such conductive particles include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, and particles obtained by using particles of a non-magnetic metal, particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold having good conductivity are preferably used.

No particular limitation is imposed on the means for coating the surfaces of the core particles with the conductive metal. However, for example, a chemical plating, electroplating, sputtering or vapor deposition process is used.

When those obtained by coating the surfaces of the core particles with the conductive metal are used as the conductive particles, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The particle diameter of the conductive particles is preferably 1 to 100 μm, more preferably 2 to 50 μm, still more preferably 3 to 30 μm, particularly preferably 4 to 20 μm.

The particle diameter distribution (Dw/Dn) of the conductive particles is preferably 1 to 10, more preferably 1.01 to 7, still more preferably 1.05 to 5, particularly preferably 1.1 to 4.

When conductive particles satisfying such conditions are used, the resulting conductive path-forming parts 11 become easy to deform under pressure, and sufficient electrical contact is achieved among the conductive particles in the conductive path-forming parts 11.

No particular limitation is imposed on the form of the conductive particles. However, they are preferably in the form of a sphere or star, or secondary particles obtained by aggregating these particles from the viewpoint of permitting easy dispersion of these particles in the polymeric substance-forming material.

Those obtained by treating surfaces of the conductive particles with a coupling agent such as a silane coupling agent, or a lubricant may be suitably used. By treating the surfaces of the particles with the coupling agent or lubricant, the durability of the resulting anisotropically conductive connector is improved.

Such conductive particles are preferably used in a proportion of 5 to 60%, more preferably 7 to 50% in terms of volume fraction to the polymeric substance-forming material. If this proportion is lower than 5%, conductive path-forming parts 11 sufficiently low in electric resistance value may not be obtained in some cases. If the proportion exceeds 60% on the other hand, the resulting conductive path-forming parts 11 are liable to be brittle, so that elasticity required of the conductive path-forming parts 11 may not be achieved in some cases.

As the conductive particles used in the conductive path-forming parts 11, are preferred those having surfaces coated with gold. When the target electrodes to be connected, for example, electrodes to be inspected in a circuit device, which is an inspection target, are composed of a solder containing lead, however, the conductive particles contained in one elastic layer 10B coming into contact with the electrodes to be inspected, which are composed of the solder, are preferably coated with a diffusion-resistive metal selected from rhodium, palladium, ruthenium, tungsten, molybdenum, platinum, iridium, silver and alloys containing these metals, whereby diffusion of the lead element into the coating layer of the conductive particles can be prevented.

The conductive particles having surfaces coated with the diffusion-resistive metal can be formed by coating the surfaces of core particles composed of, for example, nickel, iron, cobalt or an alloy thereof, with the diffusion-resistive metal by, for example, a chemical plating, electroplating, sputtering or vapor deposition process.

The coating amount of the diffusion-resistive metal is preferably in a proportion of 5 to 40%, more preferably 10 to 30% in terms of mass fraction to the conductive particles.

As the non-magnetic insulating particles contained in one elastic layer 10B, may be used diamond powder, glass powder, ceramic powder, ordinary silica powder, colloidal silica, aerogel silica, alumina or the like. Among these, diamond powder is preferred.

When such non-magnetic insulating particles are contained in one elastic layer 10B, the hardness of said one elastic layer 10B becomes still higher, and so high repetitive durability can be achieved, and the diffusion of the lead element making up the electrodes to be inspected into the coating layer of the conductive particles can be prevented. In addition, adhesion of the anisotropically conductive film 10A to a circuit device, which is an inspection target, can be inhibited.

The particle diameter of the non-magnetic insulating particles is preferably 0.1 to 50 μm, more preferably 0.5 to 40 μm, still more preferably 1 to 30 μm. If the particle diameter is too small, it is difficult to sufficiently impart the effect of inhibiting permanent deformation and deformation by abrasion to the resulting one elastic layer 10B. When non-magnetic insulating particles having a too small particle diameter are used in a great amount, the flowability of a molding material for obtaining said one elastic layer 10B is lowered, so that it may be difficult in some cases to orient the conductive particles in such molding material by a magnetic field.

If the particle diameter is too great on the other hand, it may be difficult in some cases to obtain conductive path-forming parts 11 low in electric resistance value due to presence of such non-magnetic insulating particles in the conductive path-forming parts 11.

No particular limitation is imposed on the amount of the non-magnetic insulating particles used. If the amount of the non-magnetic insulating particles used is small, however, the hardness of the resulting one elastic layer 10B is not increased. If the amount of the non-magnetic insulating particles used is great, it impossible to sufficiently achieve the orientation of the conductive particles by a magnetic field in a production process, which will be described subsequently. It is hence not preferable to use the non-magnetic insulating particles in such a small or great amount. The practical amount of the non-magnetic insulating particles used is 5 to 90 parts by weight per 100 parts by weight of the elastic polymeric substance forming one elastic layer 10B.

As a material forming the supporting body 71, is preferably used that having a coefficient of linear thermal expansion of at most $3 \times 10^{-5}$/K, more preferably $2 \times 10^{-5}$ down to $1 \times 10^{-6}$/K, particularly preferably $6 \times 10^{-6}$ down to $1 \times 10^{-6}$/K.

As a specific material, a metallic material or non-metallic material is used.

As the metallic material, may be used gold, silver, copper, iron, nickel, cobalt or an alloy thereof.

As the non-metallic material, may be used a resin material having high mechanical strength, such as a polyimide resin, polyester resin, polyaramide resin or polyamide resin, a composite resin material such as a glass fiber-reinforced epoxy resin, glass fiber-reinforced polyester resin or glass fiber-reinforced polyimide resin, or a composite resin material with an inorganic material such as silica, alumina or boron nitride as a filler mixed into an epoxy resin or the like. Among these, the polyimide resin, the composite resin material such as a glass fiber-reinforced epoxy resin, or the composite resin material such as an epoxy resin mixed with boron nitride as a filler is preferred in that it is low in coefficient of thermal expansion.

According to the anisotropically conductive connector 10 described above, the durometer hardness of the elastic polymeric substance forming one elastic layer 10B of the elastic layers forming the surfaces of the anisotropically conductive film 10A is at least 30, so that the anisotropically conductive sheet is prevented from causing permanent deformation by the contact of the target electrodes to be connected with pressure and deformation by abrasion even if the target electrodes to be connected are those projected. In addition, since the durometer hardness of the elastic polymeric substance forming the other elastic layer 10C is sufficiently lower than that of the elastic polymeric substance forming one elastic layer 10B, necessary conductivity is surely achieved by pressurizing the conductive path-forming parts 11. Accordingly, stable conductivity is achieved over a long period of time even when the conductive path-forming parts are pressed repeatedly by the target electrodes to be connected.

Since one elastic layer 10B contains the non-magnetic insulating particles, the hardness of one elastic layer 10B is increased, whereby occurrence of the permanent deformation by the contact of the target electrodes to be connected with pressure and deformation by abrasion can be more inhibited, and moreover the migration of the electrode material to the conductive particles is prevented or inhibited, so that more stable conductivity is achieved over a long period of time, and the anisotropically conductive connector can be prevented or inhibited from adhering to a circuit device even when it is used in a state brought into contact under pressure with the circuit device under a high-temperature environment.

Such an anisotropically conductive connector 10 can be produced in the following manner.

Figure 6:
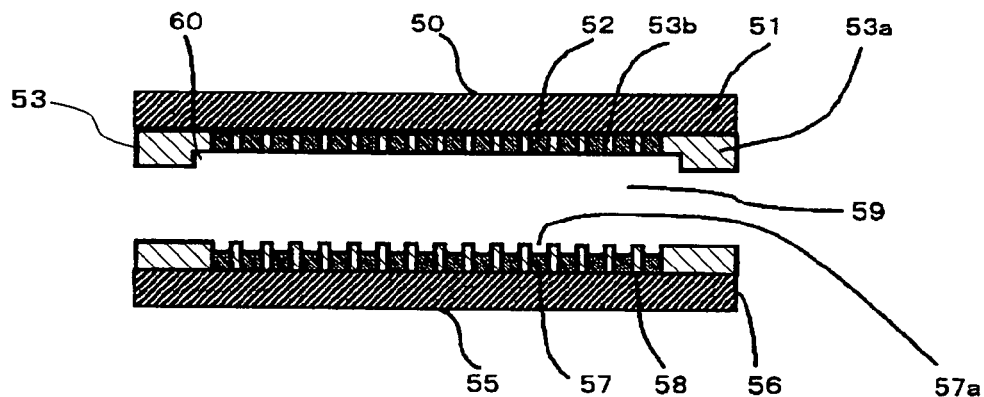
FIG. 6 is a cross-sectional view illustrating the construction of an exemplary mold for molding an anisotropically conductive film.

FIG. 6 is a cross-sectional view illustrating the construction of an exemplary mold used for producing the anisotropically conductive connector according to the present invention. This mold is so constructed that a top force (mold section) 50 and a bottom force (mold section) 55 making a pair therewith are arranged so as to be opposed to each other. A molding cavity 59 is defined between a molding surface (lower surface in FIG. 6) of the top force (mold section) 50 and a molding surface (upper surface in FIG. 6) of the bottom force (mold section) 55.

In the top force 50, ferromagnetic substance layers 52 are formed in accordance with an arrangement pattern corresponding to a pattern of the conductive path-forming parts 11 in the intended anisotropically conductive connector 10 on a surface (lower surface in FIG. 6) of a ferromagnetic substance substrate 51, and non-magnetic substance layers 53 composed of portions 53b (hereinafter referred to as "portions 53b" merely) having substantially the same thickness as the thickness of the ferromagnetic substance layers 52 and portions 53a (hereinafter referred to as "portions 53a" merely) having a thickness greater than the thickness of the ferromagnetic substance layers 52 are formed at other places than the ferromagnetic substance layers 52. A difference in level is defined between the portions 53a and the portion 53b in the non-magnetic substance layers 53, thereby forming a recess 60 in the surface of the top force 50.

In the bottom force 55 on the other hand, ferromagnetic substance layers 57 are formed in accordance with a pattern corresponding to the pattern of the conductive path-forming parts 11 in the intended anisotropically conductive connector 10 on a surface (upper surface in FIG. 6) of the ferromagnetic substance substrate 56, and non-magnetic substance layers 58 having a thickness greater than the thickness of the ferromagnetic substance layers 57 are formed at other places than the ferromagnetic substance layers 57. A difference in level is defined between the non-magnetic substance layers 58 and the ferromagnetic substance layers 57, thereby forming recessed spaces 57a for forming projected portions 11a in the molding surface of the bottom force 55.

As a material for forming the respective ferromagnetic substance substrates 51, 56 in the top force 50 and bottom force 55, may be used a ferromagnetic metal such as iron, iron-nickel alloy, iron-cobalt alloy, nickel or cobalt. The ferromagnetic substance substrates 51, 56 preferably have a thickness of 0.1 to 50 mm, and surfaces thereof are preferably smooth, and subjected to a chemical degreasing treatment and mechanical polishing treatment.

As a material for forming the ferromagnetic substance layers 52, 567 in both top force 50 and bottom force 55, may be used a ferromagnetic metal such as iron, iron-nickel alloy, iron-cobalt alloy, nickel or cobalt. The ferromagnetic substance layers 52, 57 preferably have a thickness of at least 10 µm. If this thickness is smaller than 10 µm, it is difficult to apply a magnetic field having sufficient intensity distribution to the molding material layers formed in the mold. As a result, it is difficult to gather the conductive particles at a high density at portions to become conductive path-forming parts 11 in the molding material layers, and so a good anisotropically conductive connector may not be provided in some cases.

As a material for forming the non-magnetic substance layers 53, 58 in both top force 50 and bottom force 55, may be used a non-magnetic metal such as copper, a polymeric substance having heat resistance, or the like. However, a polymeric substance cured by radiation may preferably be used in that the non-magnetic substance layers 53, 58 can be easily formed by a technique of photolithography. As a material thereof, may be used, for example, a photoresist such as an acrylic type dry film resist, epoxy type liquid resist or polyimide type liquid resist.

The thickness of the non-magnetic substance layers 58 in the bottom force 55 is preset according to the projected height of the projected portions 11a to be formed and the thickness of the ferromagnetic substance layers 57.

The anisotropically conductive connector 10 is produced, for example, in the following manner using the mold described above.

Figure 7:
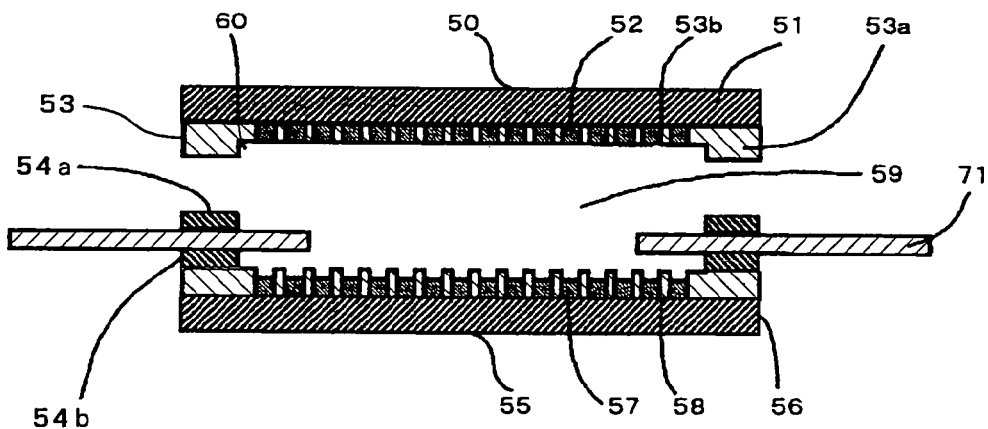
FIG. 7 is a cross-sectional view illustrating a state that a spacer and a supporting body have been arranged on the molding surface of a bottom force.

As illustrated in FIG. 7, frame-like spacers 54a, 54b and a supporting body 71 having such opening 73 and positioning holes 72 as illustrated in FIGS. 4 and 5 are first provided, and the supporting body 71 is fixed and arranged at a prescribed position of the bottom force 55 through the frame-like spacer 54b. Further, the frame-like spacer 54a is arranged on the supporting body 71.

On the other hand, a first molding material in the form of paste for forming the elastic layer 10B was prepared by dispersing conductive particles exhibiting magnetism and non-magnetic insulating particles in a curable polymeric substance-forming material, and a second molding material in the form of paste for forming the elastic layer 10C was prepared by dispersing conductive particles exhibiting magnetism in a curable polymeric substance-forming material. Here, the polymeric substance-forming material used in the first molding material is such that an elastic polymeric substance obtained by curing it satisfies the conditions of hardness $H_1$, while the polymeric substance-forming material used in the second molding material is such that an elastic polymeric substance obtained by curing it satisfies the conditions of hardness $H_2$.

Figure 8:
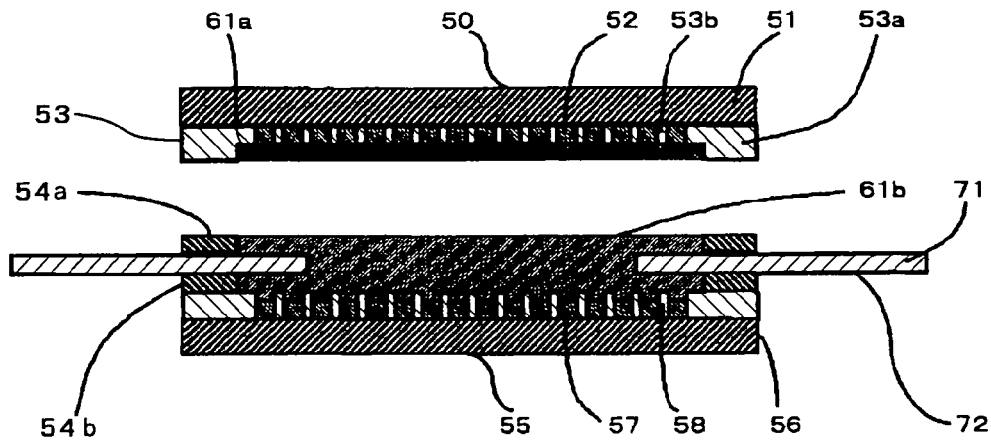
FIG. 8 is a cross-sectional view illustrating a state that a first molding material layer has been formed on the molding surface of a top force, and a second molding material layer has been formed on the molding surface of the bottom force.

As illustrated in FIG. 8, the first molding material is then charged into the recess 60 (see FIG. 6) in the molding surface of the top force 50, thereby forming a first molding material layer 61a. On the other hand, the second molding material is charged into a cavity defined by the bottom force 50, the spacers 54a and 54b, and the supporting body 71, thereby forming a second molding material layer 61b.

Figure 9:
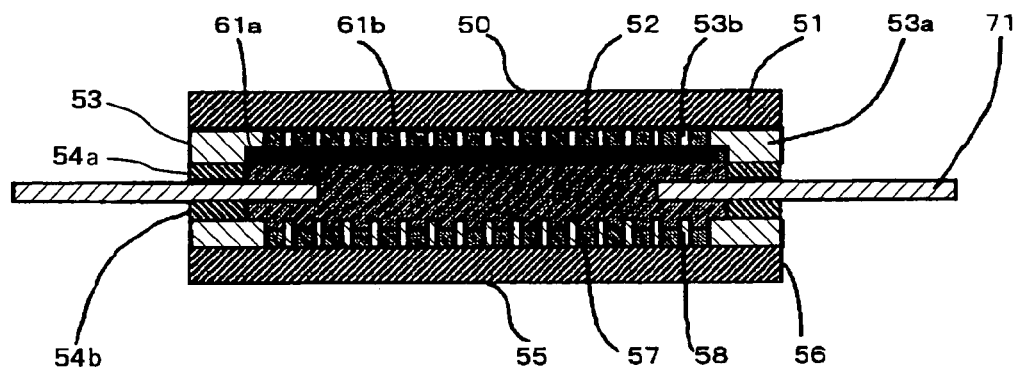
FIG. 9 is a cross-sectional view illustrating a state that the first molding material layer has been laminated on the second molding material layer.

As illustrated in FIG. 9, the top force 50 is arranged in alignment on the spacer 54a, whereby the first molding material layer 61a is laminated on the second molding material layer 61b.

Electromagnets (not illustrated) arranged on the upper surface of the ferromagnetic substance substrate 51 in the top force 50 and on the lower surface of the ferromagnetic substance substrate 56 in the bottom force 55 are operated, whereby a parallel magnetic field having a intensity distribution, i.e., a parallel magnetic field having higher intensity at portions between the ferromagnetic substance layers 52 of the top force 50 and their corresponding ferromagnetic substance layers 57 of the bottom force 55, is applied to the thickness-wise directions of the first molding material layer 61a and the second molding material layer 61b. As a result, in the first molding material layer 61a and the second molding material layer 61b, the conductive particles dispersed in the respective molding material layers are gathered at portions to become the conductive path-forming parts 11 located between each of the ferromagnetic substance layers 52 of the top force 50 and their corresponding ferromagnetic substance layers 57 of the bottom force 55, and oriented so as to align in the thickness-wise directions of the respective molding material layers.

Figure 10:
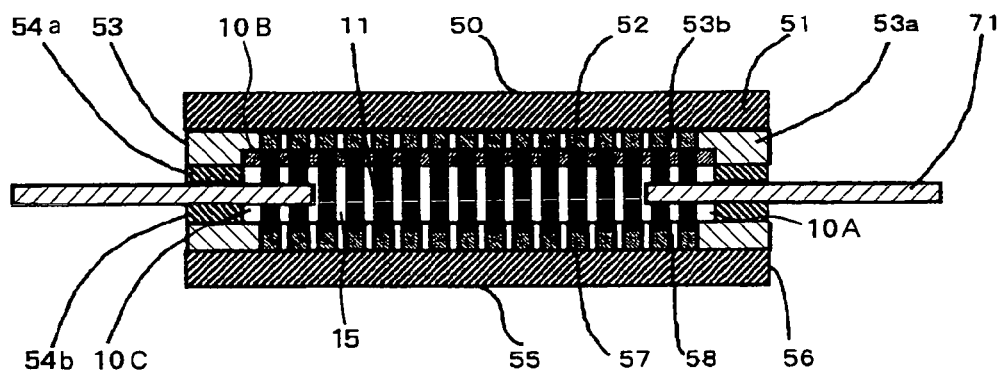
FIG. 10 is a cross-sectional view illustrating a state that an anisotropically conductive film has been formed.

In this state, the respective molding material layers are subjected to a curing treatment, thereby forming an anisotropically conductive film 10A, which has conductive path-forming parts 11, in which the conductive particles are charged at high density in the elastic polymeric substance in a state oriented so as to align in the thickness-wise direction, and insulating parts 15 formed so as to surround the conductive path-forming parts 11 and composed of the insulating elastic polymeric substance, in which the conductive particles are not present at all or scarcely present, and is composed of 2 elastic layers 10B, 10C, which are each formed by the insulating elastic polymeric substance and are integrally laminated on each other as illustrated in FIG. 10. An anisotropically conductive connector 10 of the structure shown in FIGS. 1 to 3 is thus produced.

In the above-described process, the curing treatment of the respective molding material layers may be conducted in a state that the parallel magnetic field has been applied as it is, or may also be conducted after the application of the parallel magnetic field is stopped.

The intensity of the parallel magnetic field applied to the respective molding material layers is preferably an intensity that it amounts to 20,000 to 1,000,000 µT on the average.

As a means for applying the parallel magnetic field to the respective polymeric material layers, permanent magnets may also be used in place of the electromagnets. As such permanent magnets, are preferred those composed of alunico (Fe—Al—Ni—Co alloy), ferrite or the like in that the intensity of a parallel magnetic field within the above range is achieved.

The curing treatment of the respective molding material layers is suitably selected according to the materials used. However, heating process is normally conducted. Specific heating temperature and heating time are suitably selected in view of the kinds of the polymeric substance-forming materials making up the molding material layers, and the like, the time required for movement of the conductive particles, etc.

According to such a production process, the first molding material layer 61a formed on the molding surface of the top force 50 is stacked on the second molding material layer 61b formed on the molding surface of the bottom force 55, and the respective molding material layers are subjected to a curing treatment in this state, so that an anisotropically conductive connector 10 having a anisotropically conductive film 10A composed of at least 2 elastic layers that are different in hardness from each other and integrally laminated on each other can be advantageously and surely produced.

Figure 11:
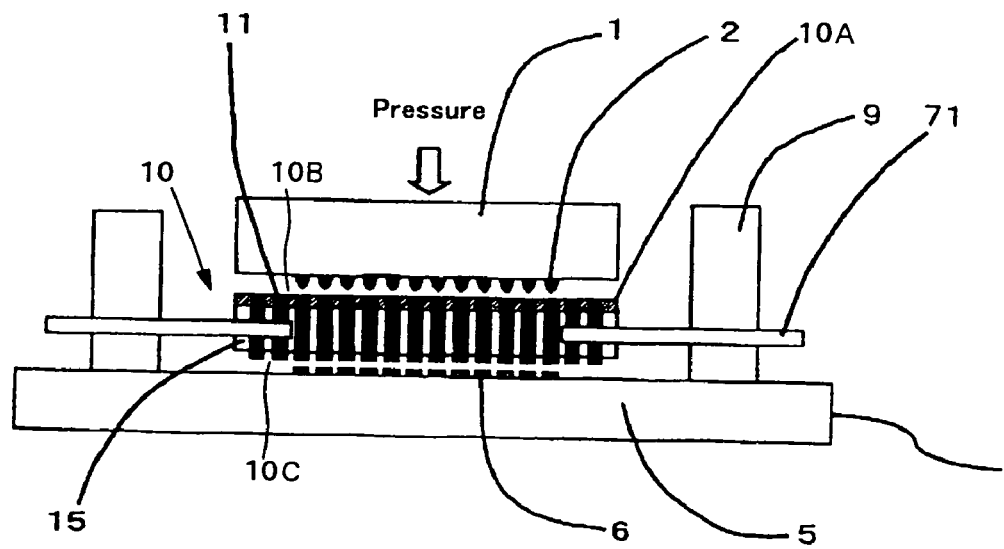
FIG. 11 illustrates the construction of an exemplary inspection apparatus for circuit devices according to the present invention together with a circuit device.

FIG. 11 schematically illustrates the construction of an exemplary inspection apparatus for circuit devices according to the present invention.

The inspection apparatus for circuit devices is provided with a circuit board 5 for inspection having guide pins 9. On a front surface (upper surface in FIG. 11) of the circuit board 5 for inspection, inspection electrodes 6 are formed in accordance with a pattern corresponding to a pattern of semispherical solder ball electrodes 2 of a circuit device 1 that is an inspection target.

On the front surface of the circuit board 5 for inspection, is arranged an anisotropically conductive connector 10 of the structure illustrated in FIGS. 1 to 3. Specifically, the guide pins 9 are inserted into positioning holes 72 (see FIGS. 1 to 3) formed in a supporting body 71 in the anisotropically conductive connector 10, whereby the anisotropically conductive connector 10 is fixed on the surface of the circuit board 5 for inspection in a state that the conductive path-forming parts 11 in the anisotropically conductive film 10A have been positioned so as to be located on the inspection electrodes 6.

In such an inspection apparatus for circuit devices, the circuit device 1 is arranged on the anisotropically conductive connector 10 in such a manner that the solder ball electrodes 2 are located on the conductive path-forming parts 11. In this state, for example, the circuit device 1 is pressed in a direction approaching to the circuit board 5 for inspection, whereby each of the conductive path-forming parts 11 in the anisotropically conductive connector 10 is in a state held and pressurized by the solder ball electrode 2 and the inspection electrode 6. As a result, electrical connection between each of the solder ball electrodes 2 in the circuit device 1 and each of the inspection electrodes 6 of the circuit board 5 for inspection is achieved. In this inspection state, the inspection of the circuit device 1 is conducted.

According to the inspection apparatus for circuit devices described above, the apparatus is equipped with the anisotropically conductive connector 10, so that occurrence of the permanent deformation of the anisotropically conductive film 10A by the contact of the electrodes to be inspected with pressure and its deformation by abrasion is inhibited even if the electrodes to be inspected are projected solder ball electrodes 2, and so stable conductivity is achieved over a long period of time even when inspection is conducted continuously as to a great number of circuit devices 1.

Since one elastic layer 10B of the anisotropically conductive film 10A in the anisotropically conductive connector 10 contains the non-magnetic insulating particles, the migration of the electrode material of the solder ball electrodes 2 to the conductive particles is prevented or inhibited, so that more stable conductivity is achieved over a long period of time, and the anisotropically conductive sheet can be prevented or inhibited from adhering to the circuit device 1 even when it is used in a state brought into contact under pressure with the circuit device 1 under a high-temperature environment.

Since the anisotropically conductive connector 10 is inhibited from causing the permanent deformation by the pressure contact of the electrodes to be inspected with pressure and the deformation by abrasion, the electrical inspection of circuit devices can be conducted without using any sheet-like connector, in addition to the anisotropically conductive connector 10.

When no sheet-like connector is used, positioning between the anisotropically conductive connector 10 and the sheet-like connector is unnecessary, so that the problem of positional deviation between the sheet-like connector and the anisotropically conductive connector 10 due to temperature change can be avoided, and moreover the constitution of the inspection apparatus becomes easy.

The present invention is not limited to the above-described embodiment, and various changes or modifications may be added thereto.

(1) When the anisotropically conductive connector 10 according to the present invention is used in electrical inspection of circuit devices, the electrodes to be inspected of a circuit device, which is an inspection target, are not limited to the semispherical solder ball electrodes, and they may be, for example, lead electrodes or flat plate electrodes.

(2) It is not essential to provide the supporting body, and the anisotropically conductive connector may be composed of the anisotropically conductive film alone.

(3) When the anisotropically conductive connector 10 according to the present invention is used in electrical inspection of circuit devices, the anisotropically conductive film may be caused to integrally adhere to the circuit board for inspection. According to such constitution, positional deviation between the anisotropically conductive film and the circuit board for inspection can be surely prevented.

Such an anisotropically conductive connector can be produced by using, as the mold for producing the anisotropically conductive connector, a mold having a space region for arrangement of a board, in which the circuit board 5 for inspection can be arranged, in a molding cavity, arranging the circuit board for inspection in the space region for arrangement of a board in the molding cavity of the mold, and charging a molding material into, for example, the molding cavity in this state to conduct a curing treatment.

(4) In the production process of an anisotropically conductive connector according to the present invention, the conductive path-forming parts can be formed by a laminate of layer portions having different properties from each other, so that an anisotropically conductive connector having properties corresponding to an actual state used can be obtained. Specifically, conductive path-forming parts, in which the degree of conductivity is controlled, can be formed by constrution that layer portions different in, for example, the particle diameters of the conductive particles or the contents of the conductive particles from each other are laminated, in addition to the already described construction that layer portions different in the kinds of the conductive particles from each other are laminated, or conductive path-forming parts, in which elastic property in the projected portions is controlled, can be formed by constrution that layer portions different in the kinds of the elastic polymeric substances from each other are laminated.

The anisotropically conductive connector according to the present invention can also be produced in accordance with the production processes of the anisotropically conductive connector described in Japanese Patent Application Nos. 2001-262550 and 2001-313324.

(5) In the anisotropically conductive connector according to the present invention, the conductive path-forming parts may be arranged at a fixed pitch, and part of the conductive path-forming parts may serve as effective conductive path-forming parts electrically connected to electrodes to be inspected, and the other conductive path-forming parts may serve as non-effective conductive path-forming parts not electrically connected to the electrodes to be inspected.

Figure 12:
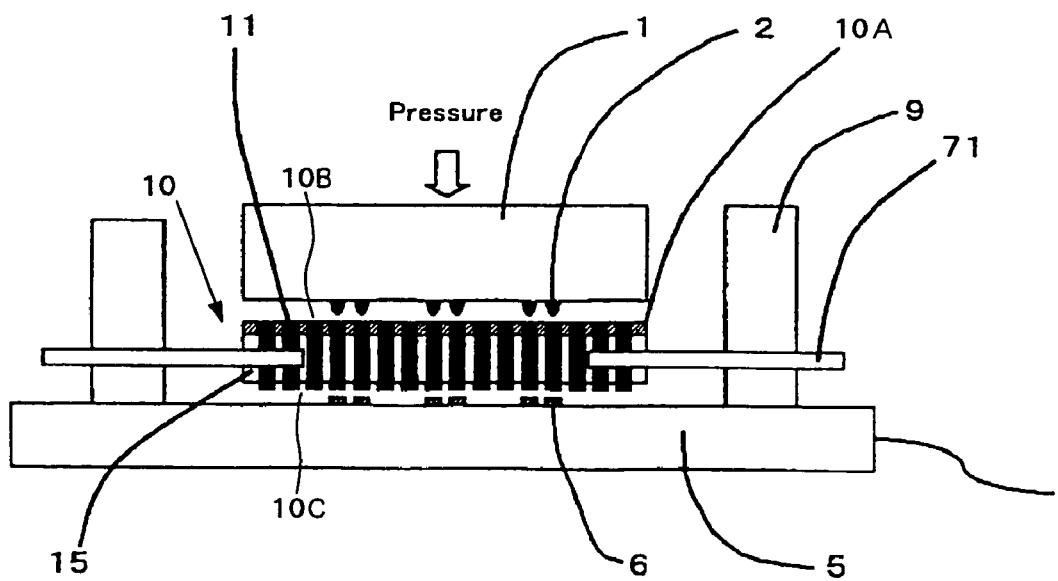
FIG. 12 illustrates the construction of the exemplary inspection apparatus for circuit devices according to the present invention together with another circuit device.

Specifically described, the circuit devices 1, which are inspection targets, include those of the construction that solder ball electrodes 2, which are electrodes to be inspected, are arranged only at partial positions among lattice point positions of a fixed pitch, for example, CSP (chip scale package), TSOP (thin small outline package), etc. as illustrated in FIG. 12. In an anisotropically conductive connector 10 for inspecting such a circuit device 1, the conductive path-forming parts 11 may be arranged in accordance with lattice point positions of substantially the same pitch as electrodes to be inspected and, conductive path-forming parts 11 located at positions corresponding to the electrodes to be inspected may serve as effective conductive path-forming parts, and the other conductive path-forming parts 11 may serve as non-effective conductive path-forming parts.

According to the anisotropically conductive connector 10 of such constitution, the ferromagnetic substance layers of the mold are arranged at a fixed pitch in the production of such an anisotropically conductive connector 10, whereby the conductive particles can be efficiently gathered and oriented at prescribed positions by applying a magnetic field to the molding material layers, and thereby the density of the conductive particles in each of the resulting conductive path-forming parts is made even. As a result, an anisotropically conductive connector that a difference of the resistance values among the respective conductive path-forming parts is small can be obtained.

(6) Specific form and structure of the anisotropically conductive film may be variously changed.

Figure 13:
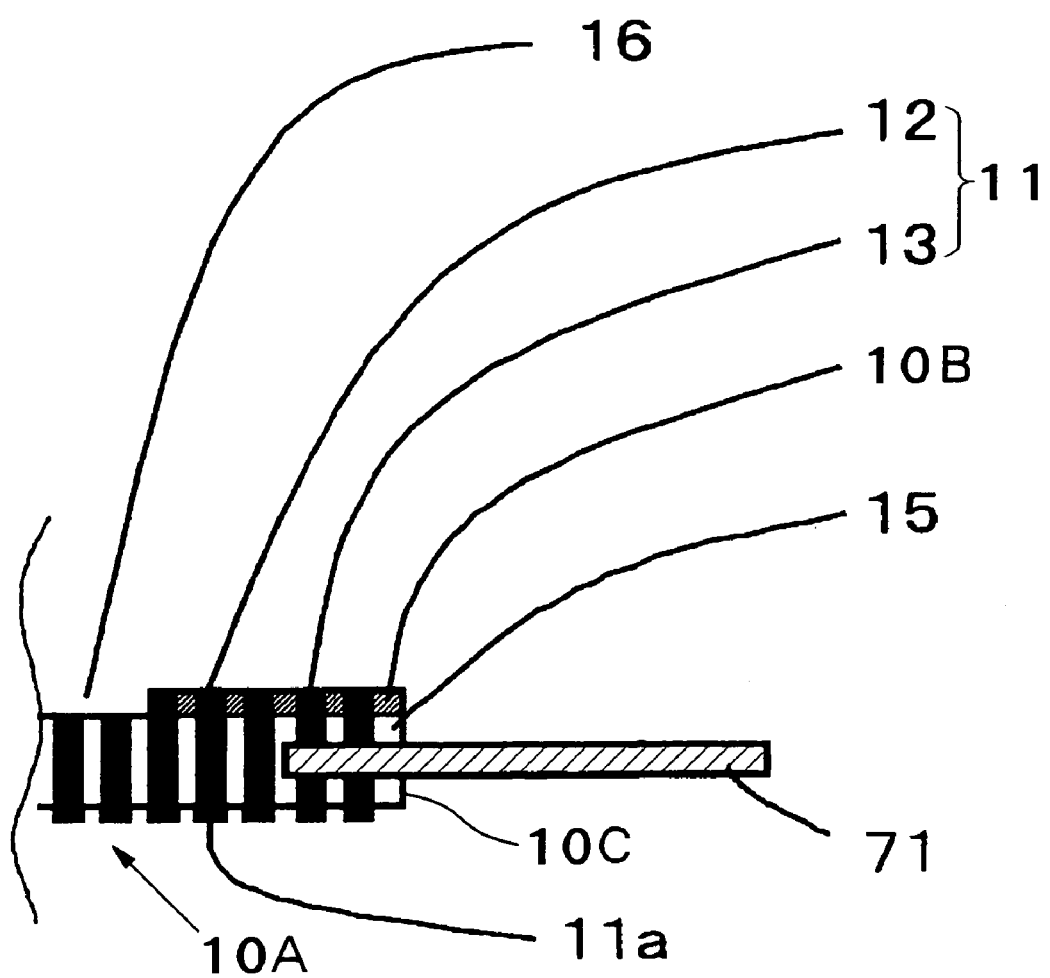
FIG. 13 is a cross-sectional view illustrating a first modified example of the anisotropically conductive film.

As illustrated in, for example, FIG. 13, the anisotropically conductive film 10A may have, at its central portion, a recess 16 on a surface coming into contact with electrodes to be inspected of a circuit device that is an inspection target.

Figure 14:
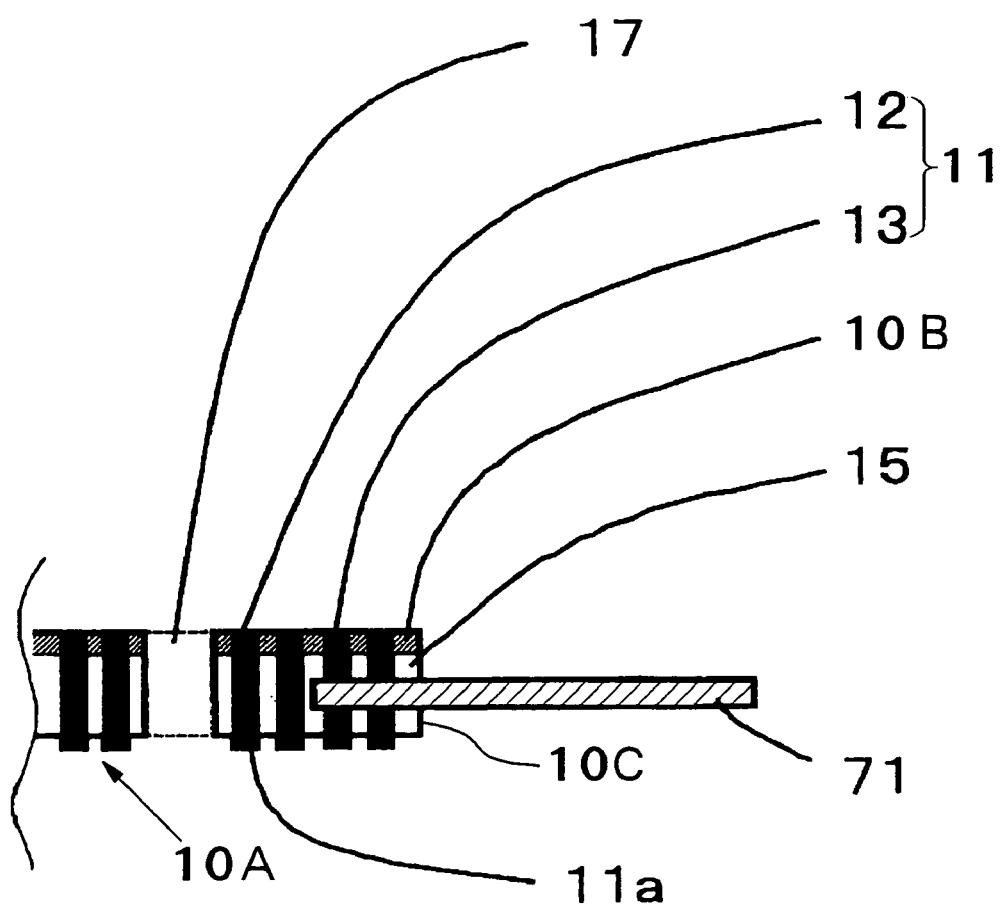
FIG. 14 is a cross-sectional view illustrating a second modified example of the anisotropically conductive film.

As illustrated in FIG. 14, the anisotropically conductive film 10A may have a through-hole 17 at its central portion.

Figure 15:
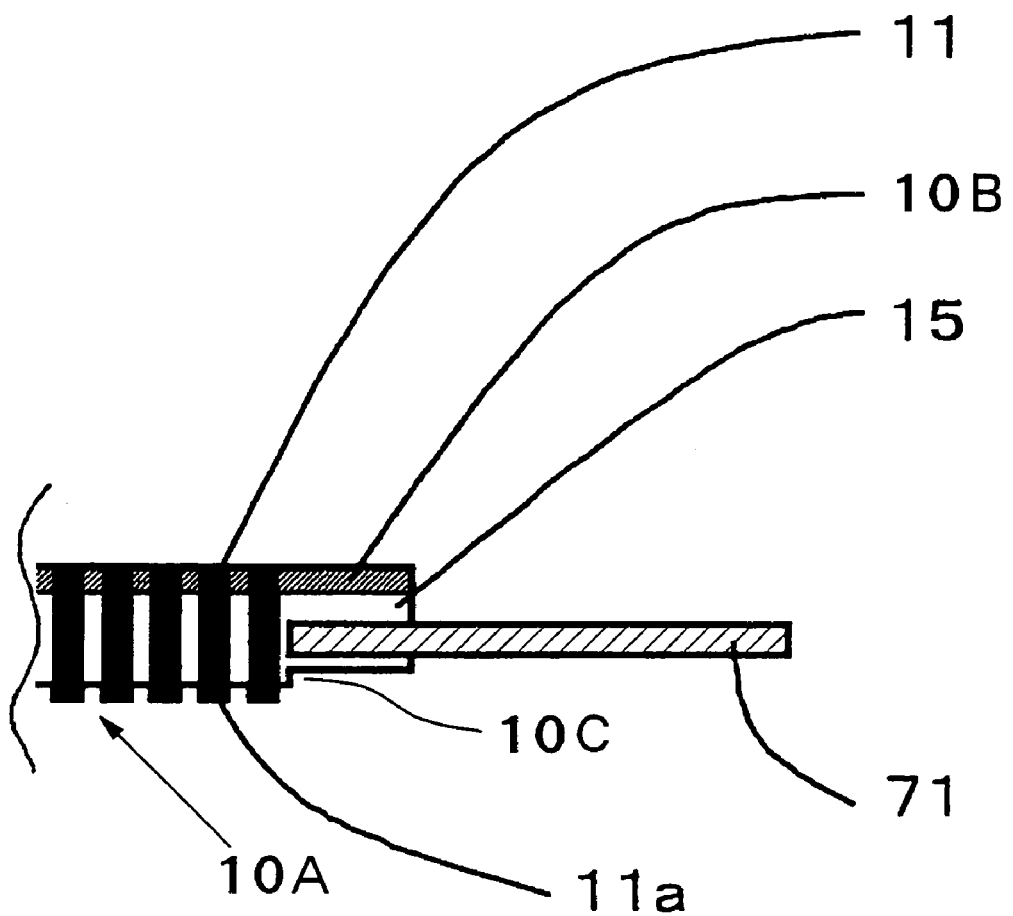
FIG. 15 is a cross-sectional view illustrating a third modified example of the anisotropically conductive film.

As illustrated in FIG. 15, the anisotropically conductive film 10A may be such that no conductive path-forming part 11 is formed at a peripheral edge portion supported by the supporting body 71, and conductive path-forming parts 11 are formed only in another region than the peripheral edge portion. All these conductive path-forming parts 11 may serve as effective conductive path-forming parts.

Figure 16:
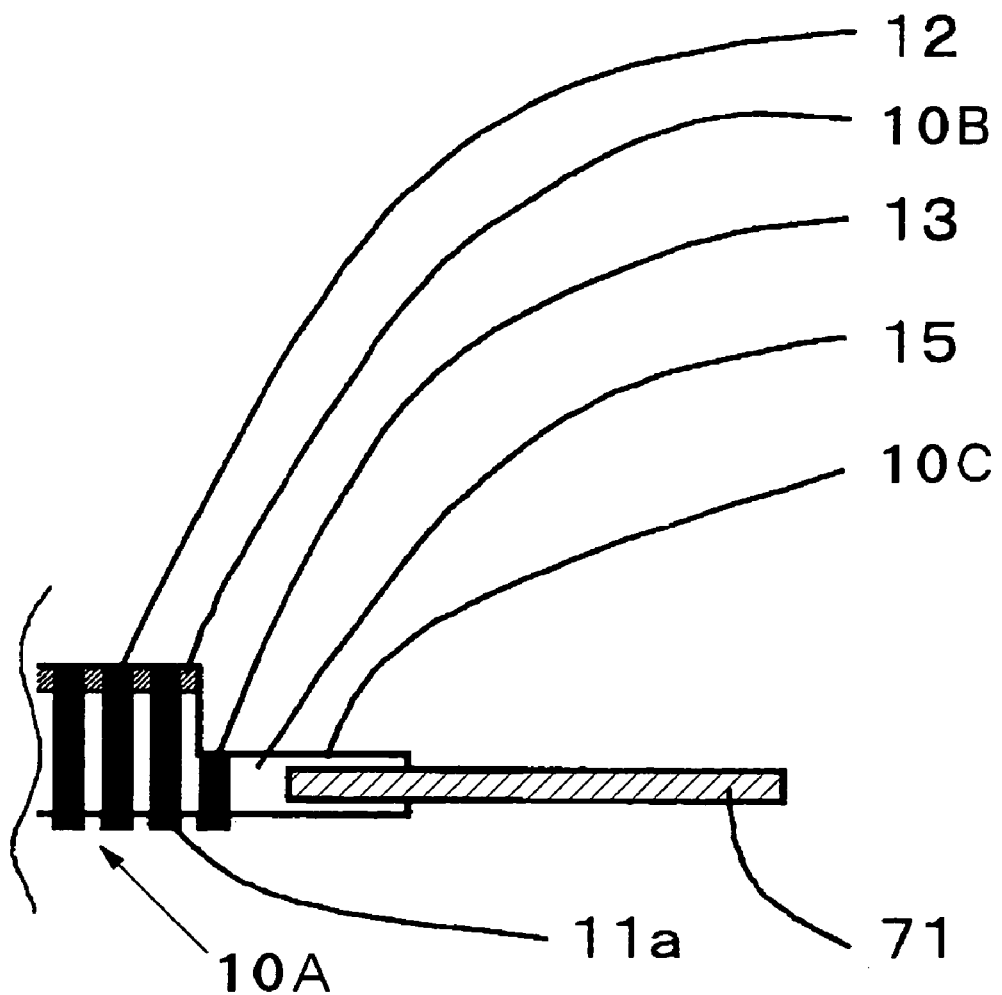
FIG. 16 is a cross-sectional view illustrating a fourth modified example of the anisotropically conductive film.

As illustrated in FIG. 16, the anisotropically conductive film 10A may be such that non-effective conductive path-forming parts 13 are formed between effective conductive path-forming parts 12 and a peripheral edge portion.

Figure 17:
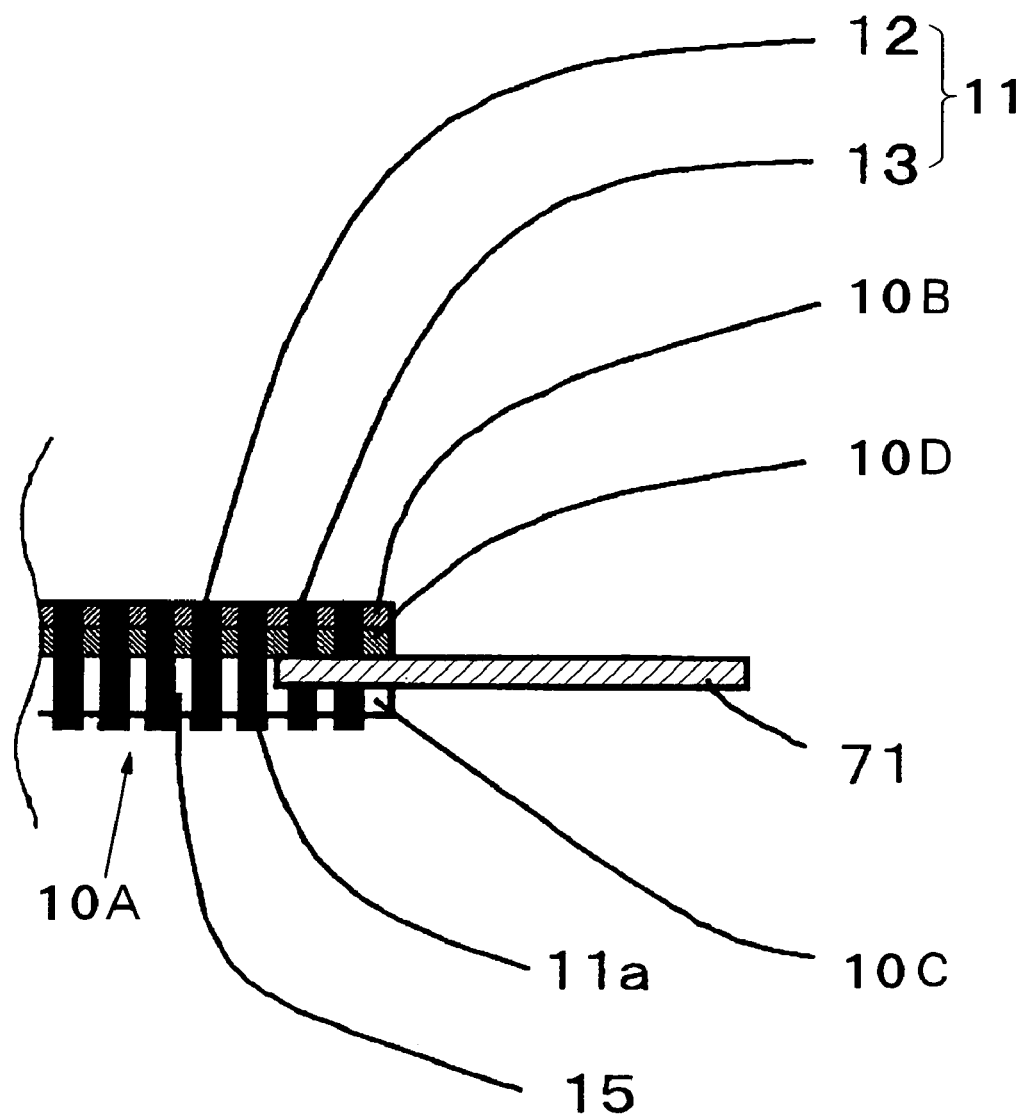
FIG. 17 is a cross-sectional view illustrating a fifth modified example of the anisotropically conductive film.

As illustrated in FIG. 17, the anisotropically conductive film 10A may be a film of a 3-layer structure having an intermediate elastic layer 10D between one elastic layer 10B and the other elastic layer 10C, which form surfaces, respectively, or of a 4 or more-layer structure.

Figure 18:
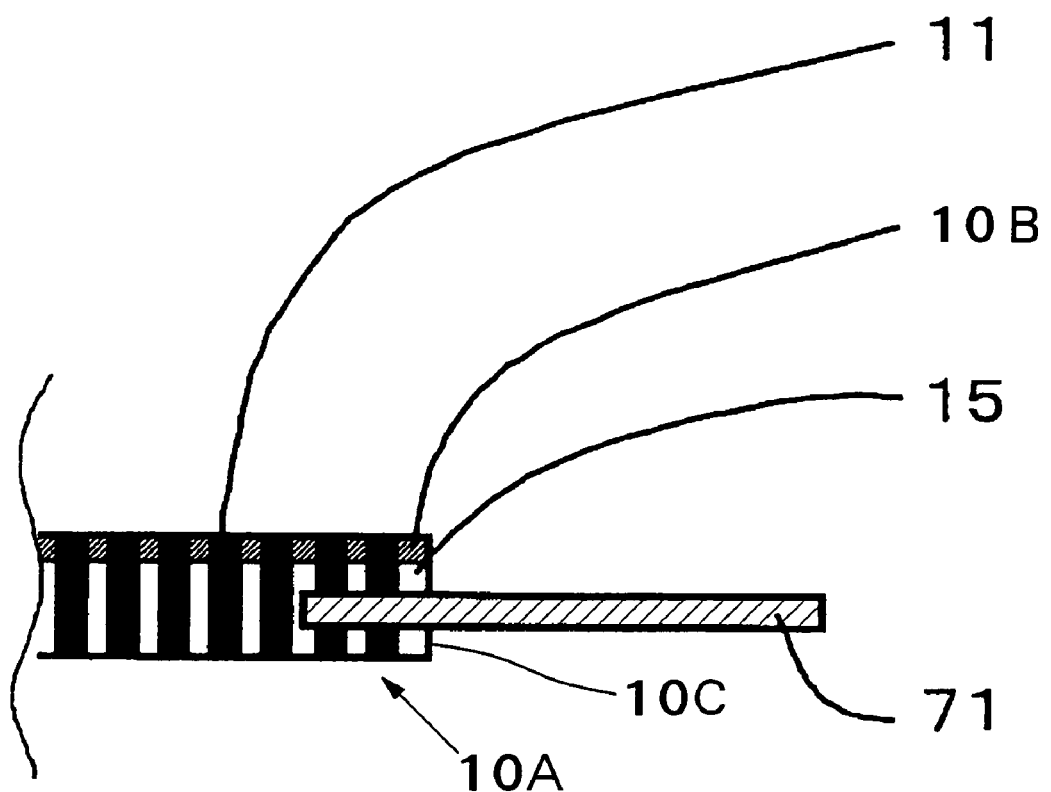
FIG. 18 is a cross-sectional view illustrating a sixth modified example of the anisotropically conductive film.

As illustrated in FIG. 18, the anisotropically conductive film 10A may be such that both surfaces thereof are made flat.

Figure 19:
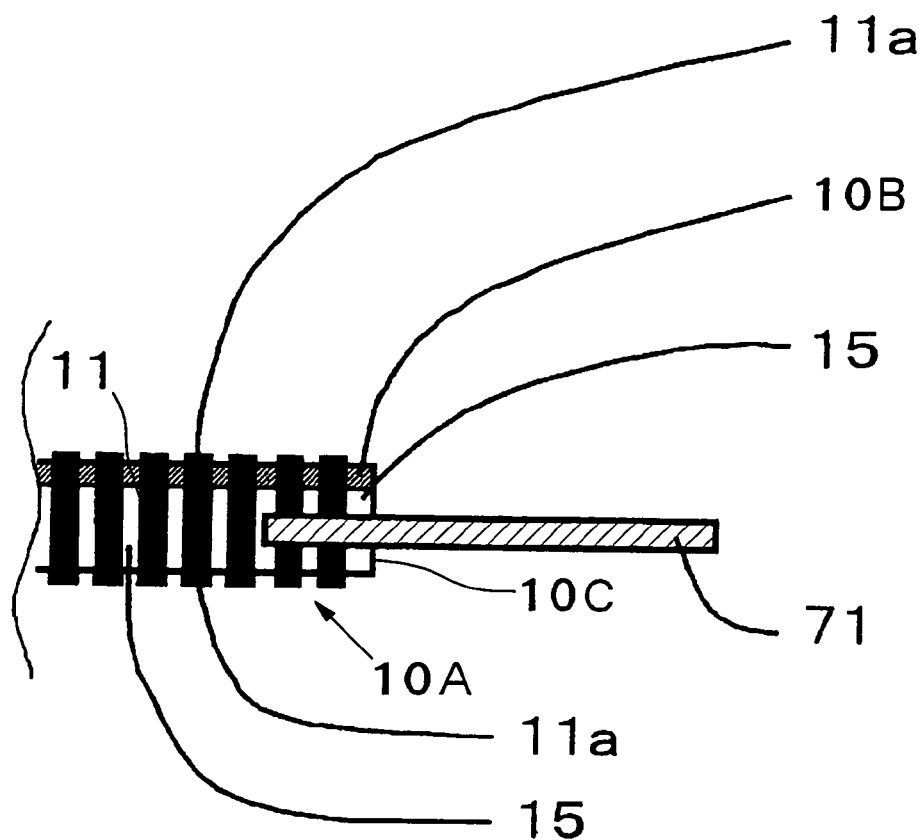
FIG. 19 is a cross-sectional view illustrating a seventh modified example of the anisotropically conductive film.

As illustrated in FIG. 19, the anisotropically conductive film 10A may be such that projected portions 11a that the surfaces of portions forming the conductive path-forming parts 11 project from the surfaces of portions forming the insulating parts 15, are formed on both one elastic layer 10B and the other elastic layer 10C, which form surfaces, respectively.

(7) In the anisotropically conductive connector according to the present invention, a reinforcing material may be contained in at least one of the respective elastic layers forming the anisotropically conductive film. As such a reinforcing material, may be suitably used that formed of mesh or nonwoven fabric.

Such a reinforcing material is contained in at least one of the respective elastic layers forming the anisotropically conductive film, whereby deformation of the conductive path-forming parts is more inhibited even when they are pressed repeatedly by target electrodes to be connected, so that more stable conductivity can be achieved over a long period of time.

As the mesh or nonwoven fabric forming the reinforcing material, that formed by organic fiber may be suitably used herein. As examples of such organic fiber, may be mentioned fluorocarbon resin fibers such as polytetrafluoroethylene fiber, aramide fiber, polyethylene fiber, polyarylate fiber, nylon fiber, and polyester fiber.

In addition, as the organic fiber, that whose coefficient of linear thermal expansion is equivalent or close to that of a material forming the target structure to be connected, specifically, that having a coefficient of linear thermal expansion of $30 \times 10^{-6}$ to $-5 \times 10^{-6}/K$, particularly $10 \times 10^{-6}$ to $-3 \times 10^{-6}/K$ is used, whereby the thermal expansion of the anisotropically conductive film is inhibited, so that a good electrically connected state to the target structure to be connected can be stably retained even when the anisotropically conductive film is subjected to thermal hysteresis by temperature change.

As the organic fiber, is preferably used that having a diameter of 10 to 200 μm.

Figure 34:
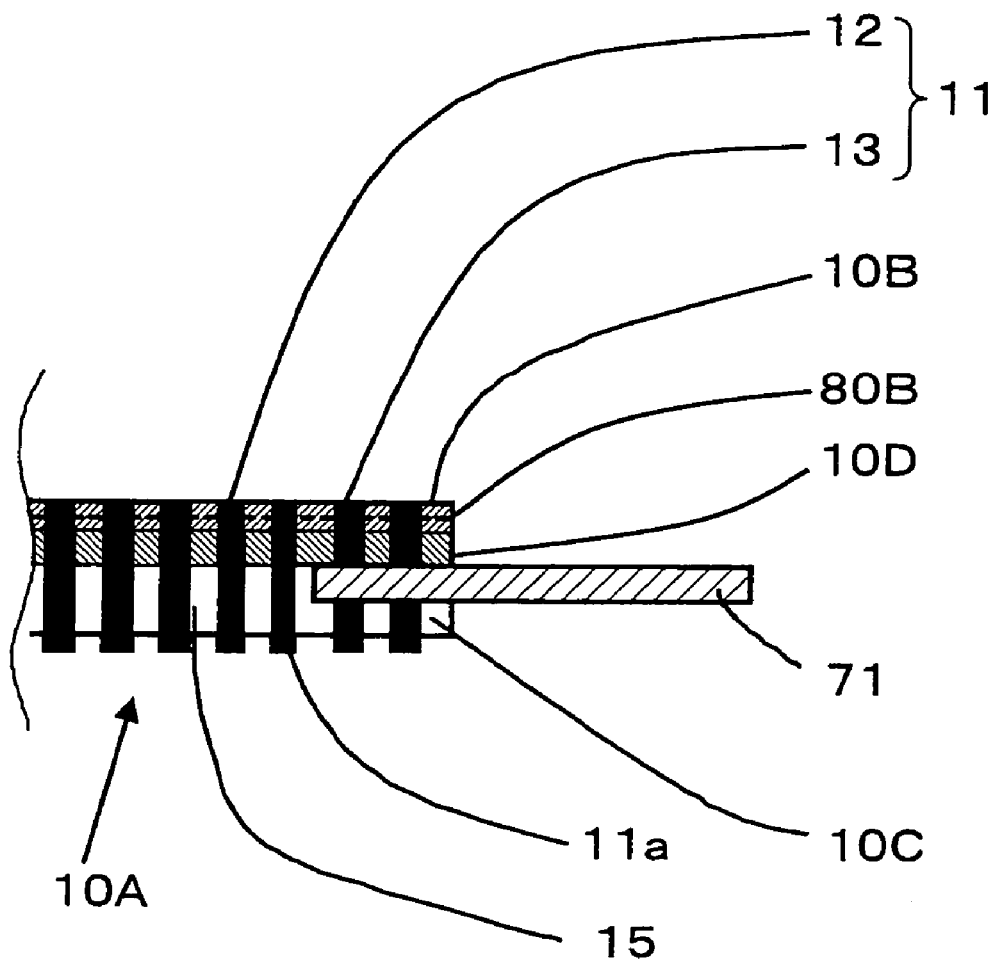
FIG. 34 is a cross-sectional view illustrating an eighth modified example of the anisotropically conductive film.
Figure 35:
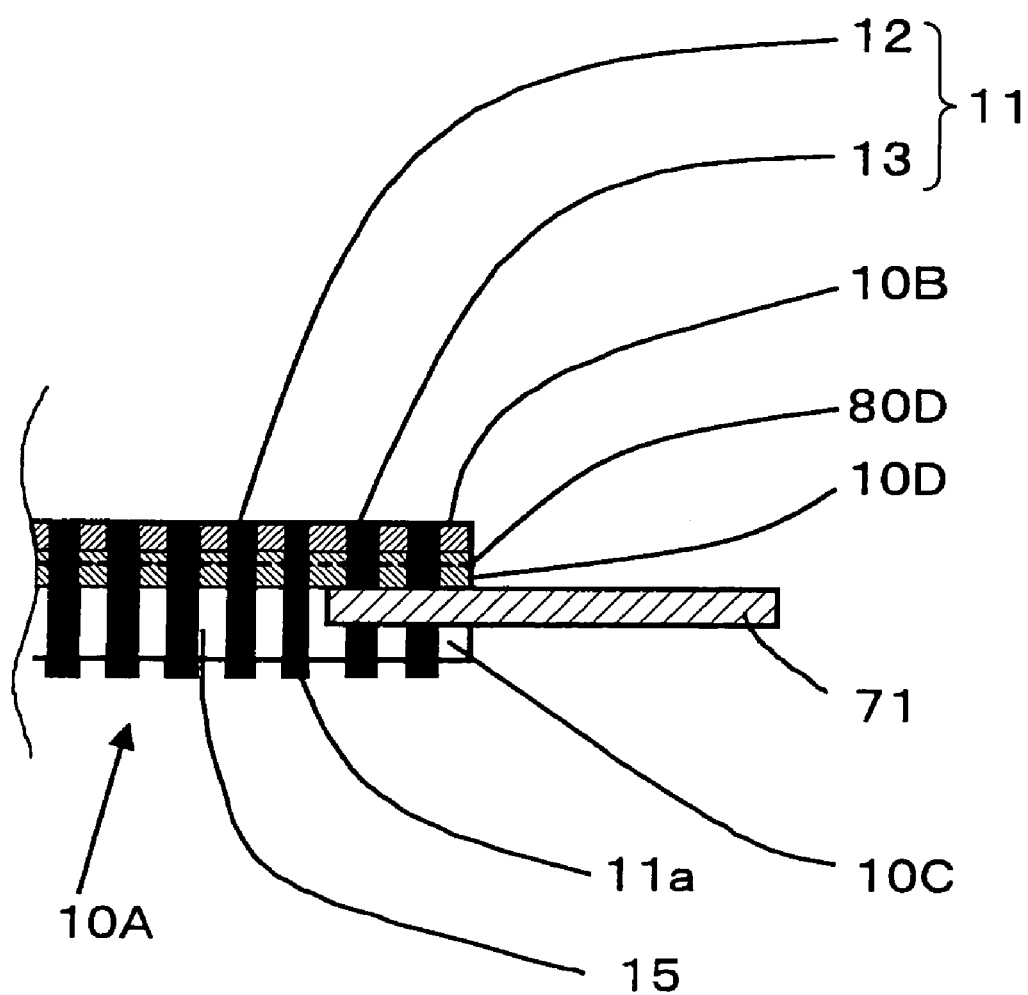
FIG. 35 is a cross-sectional view illustrating a ninth modified example of the anisotropically conductive film.
Figure 36:
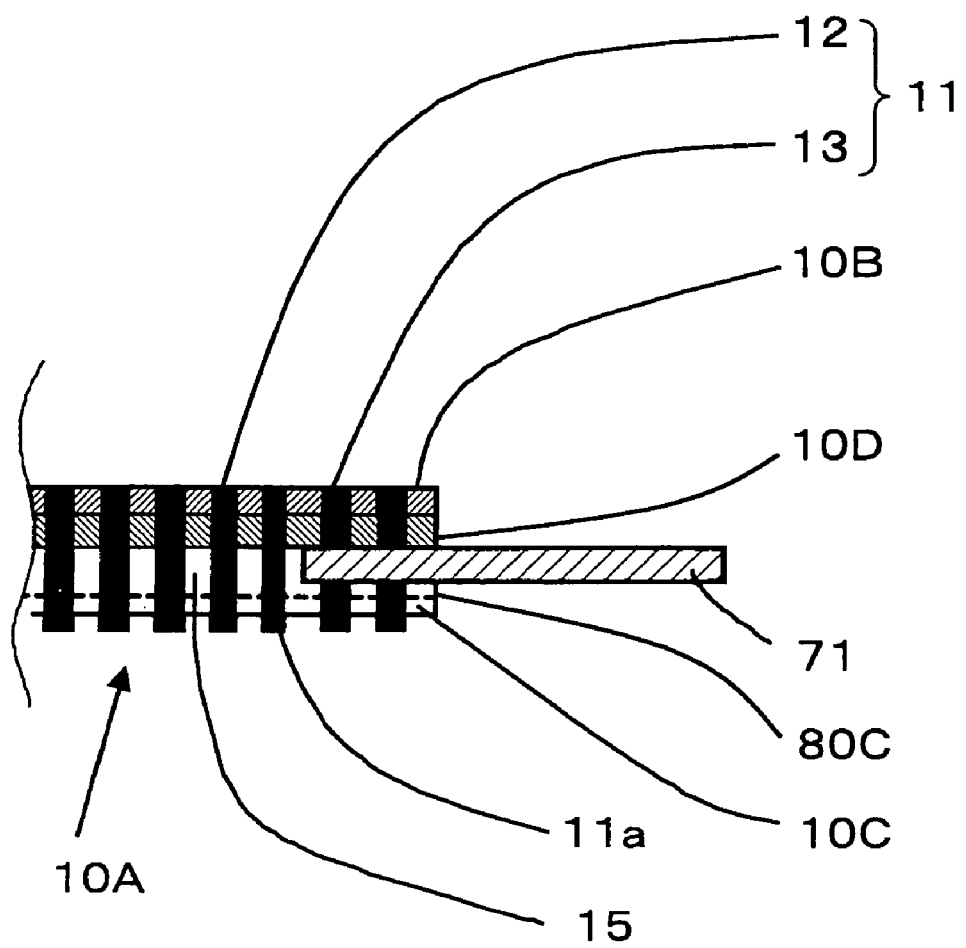
FIG. 36 is a cross-sectional view illustrating a tenth modified example of the anisotropically conductive film.

Specific examples of such anisotropically conductive connectors are shown in FIGS. 34, 35 and 36.

Specifically described, the anisotropically conductive connector shown in FIG. 34 has an anisotropically conductive film 10A of a 3-layer structure that an intermediate elastic layer 10D is formed between one elastic layer 10B and the other elastic layer 10C, which form surfaces, respectively, in which a reinforcing material 80B composed of mesh or nonwoven fabric is contained in one elastic layer 10B in the anisotropically conductive film 10A.

The anisotropically conductive connector shown in FIG. 35 has an anisotropically conductive film 10A of a 3-layer structure that an intermediate elastic layer 10D is formed between one elastic layer 10B and the other elastic layer 10C, which form surfaces, respectively, in which a reinforcing material 80D composed of mesh or nonwoven fabric is contained in the intermediate elastic layer 10D in the anisotropically conductive film 10A.

The anisotropically conductive connector shown in FIG. 36 has an anisotropically conductive film 10A of a 3-layer structure that an intermediate elastic layer 10D is formed between one elastic layer 10B and the other elastic layer 10C, which form surfaces, respectively, in which a reinforcing material 80C composed of mesh or nonwoven fabric is contained in the other elastic layer 10C in the anisotropically conductive film 10A.

Figure 20:
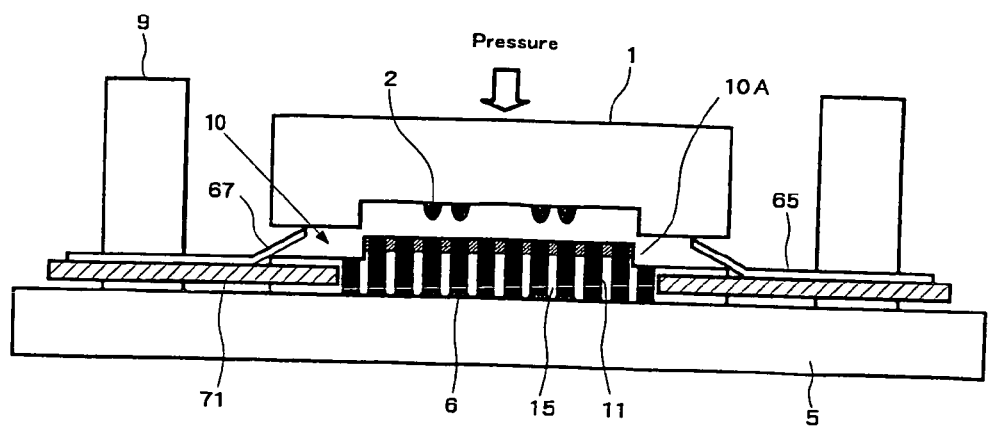
FIG. 20 illustrates the construction of a first exemplary inspection apparatus equipped with a pressurizing force-relaxing frame.

(8) In the inspection apparatus for circuit devices according to the present invention, as illustrated in FIG. 20, a pressurizing force-relaxing frame 65 for relaxing the pressurizing force of solder ball electrodes, which are electrodes to be inspected, against the anisotropically conductive film 10A of the anisotropically conductive connector 10 may be arranged between a circuit device 1, which is an inspection target, and the anisotropically conductive connector 10.

Figure 21:
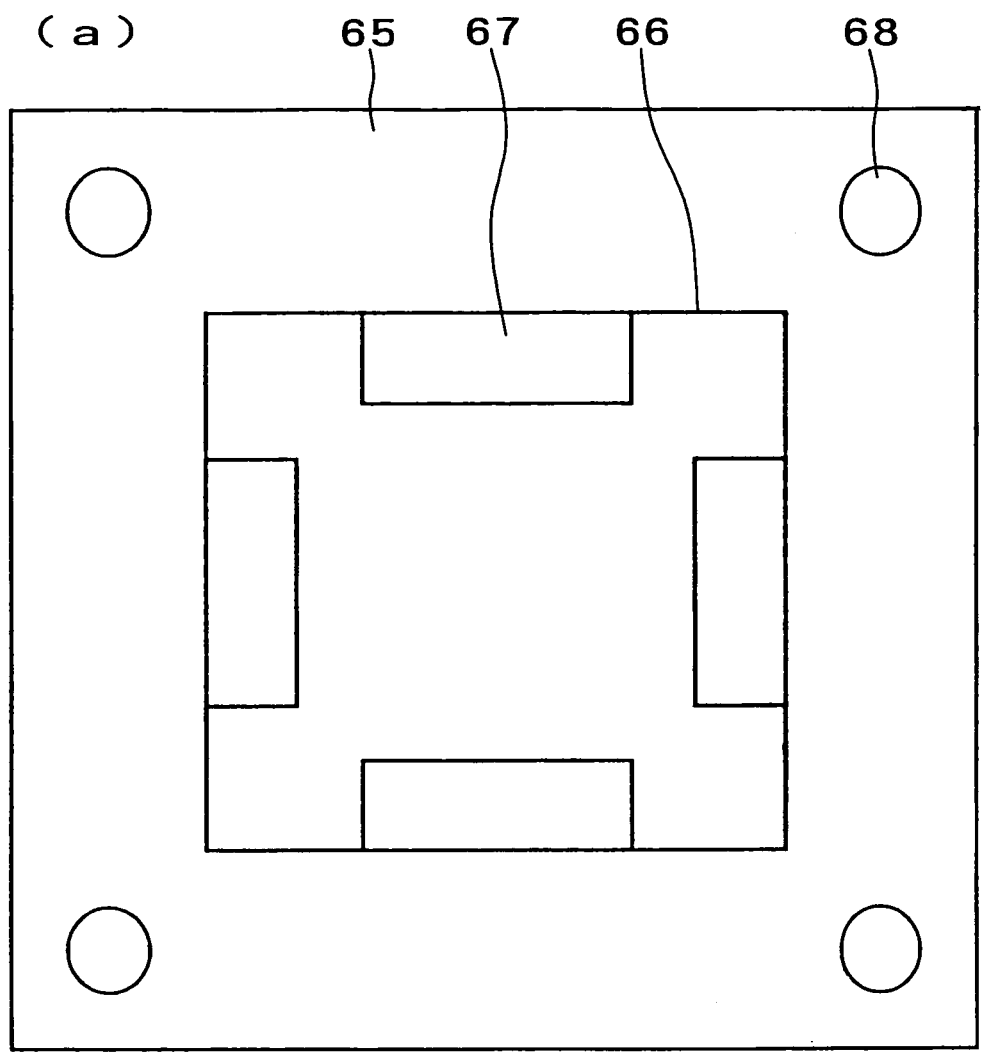
FIG. 21 illustrates a pressurizing force-relaxing frame, in which (a) is a plan view, and (b) is a side elevation.
Figure 21:
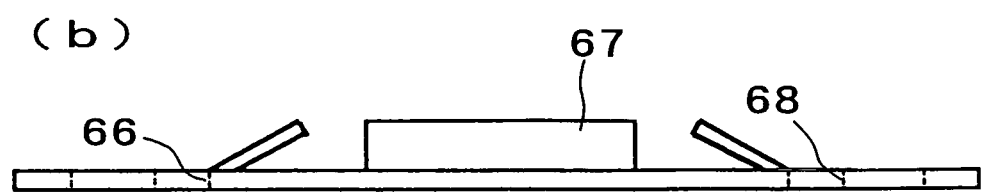

As illustrated in FIG. 21, the pressurizing force-relaxing frame 65 is in the form of a rectangular plate as a whole, and a substantially rectangular opening 66 for bringing the electrodes to be inspected of the circuit device 1, which is an inspection target, into contact with the conductive path-forming parts 11 of the anisotropically conductive connector 10 is formed at its central portion. Leaf spring parts 67 are respectively formed integrally with 4 peripheral sides of the opening 66 so as to project inwardly and slantly upward from the respective peripheral sides of the opening 66. In the embodiment illustrated, the pressurizing force-relaxing frame 65 is formed in such a manner that the opening 66 is greater in size than the anisotropically conductive film 10A in the anisotropically conductive connector 10, and arranged in such a manner that only the free tip end of each leaf spring part 67 is located above the peripheral edge portion of the anisotropically conductive film 10A. The height of the free tip end of each leaf spring part 67 is preset in such a manner that the electrodes to be inspected of the circuit device 1 come into no contact with the anisotropically conductive film 10A when the free tip end of the leaf spring part 67 comes into contact with the circuit device 1. Positioning holes 68, into which the guide pins of the circuit board 5 for inspection are inserted, are respectively formed at 4 corner positions of the pressurizing force-relaxing frame 65.

Figure 22:
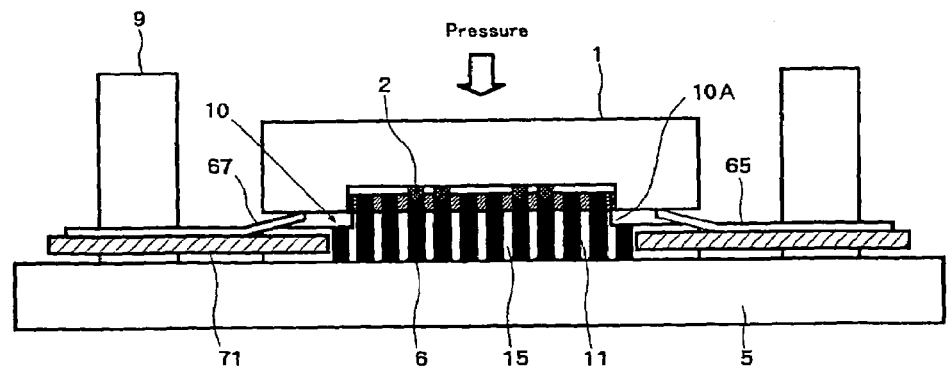
FIG. 22 illustrates a state that a circuit device has been pressurized in the inspection apparatus shown in FIG. 20.

According to the inspection apparatus for circuit devices of such construction, the pressurizing force of the solder ball electrodes 2, which are electrodes to be inspected, against the anisotropically conductive film 10A of the anisotropically conductive connector 10 is relaxed by the spring elasticity of the leaf spring parts 67 when the circuit device 1 is brought into contact under pressure with the leaf spring parts 67 of the pressurizing force-relaxing frame 65 by pressing, for example, the circuit device 1 in a direction approaching the circuit board 5 for inspection. In addition, in a state that the leaf spring parts 67 of the pressurizing force-relaxing frame 65 have been brought into contact under pressure with the peripheral edge portion of the anisotropically conductive film 10A in the anisotropically conductive connector 10 as illustrated in FIG. 22, the pressurizing force of the electrodes to be inspected against the anisotropically conductive film 10A is more relaxed by the rubber elasticity of the anisotropically conductive film 10A. Accordingly, stable conductivity is achieved in the conductive path-forming parts 11 of the anisotropically conductive film 10A over a longer period of time.

In addition, the intensity of shock applied to the anisotropically conductive film 10A by the electrodes to be inspected can be reduced by virtue of the spring elasticity by the leaf spring parts 67 of the pressurizing force-relaxing frame 65, so that breaking or any other trouble of the anisotropically conductive film 10A can be prevented or inhibited, and the circuit device 1 can be easily separated from the anisotropically conductive film 10A by the spring elasticity of the leaf spring parts 67 of the pressurizing force-relaxing frame 65 when the pressurizing force against the anisotropically conductive film 10A is released, and so the work of changing the circuit device 1 after completion of the inspection to an uninspected circuit device can be smoothly conducted. As a result, inspection efficiency of circuit devices can be improved.

(9) The pressurizing force-relaxing frame 65 is not limited to that shown in FIG. 20.

Figure 23:
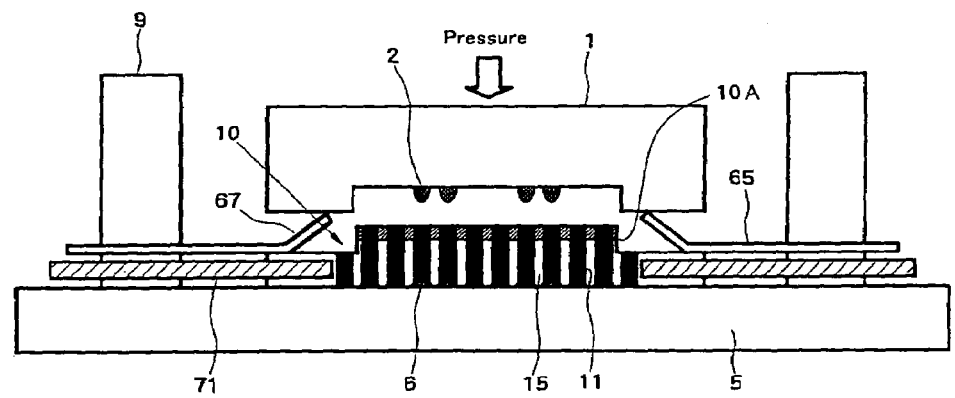
FIG. 23 illustrates the construction of a second exemplary inspection apparatus equipped with a pressurizing force-relaxing frame.

For example, the pressurizing force-relaxing frame 65 may be such that the opening 66 is smaller in size than the anisotropically conductive film 10A in the anisotropically conductive connector 10 as illustrate in FIG. 23.

Figure 24:
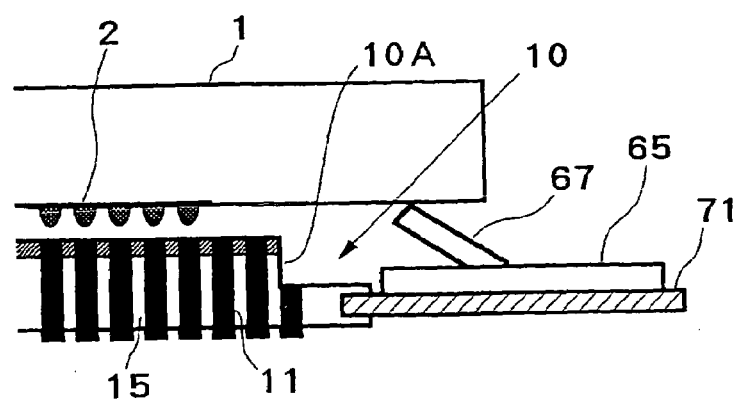
FIG. 24 illustrates the construction of a principal part of a third exemplary inspection apparatus equipped with a pressurizing force-relaxing frame.

The pressurizing force-relaxing frame 65 may also be such that the opening 66 is greater in size than the anisotropically conductive film 10A in the anisotropically conductive connector 10, and the frame is arranged in such a manner that the free tip end of each leaf spring part 67 is located above an exposed portion of the supporting body 71 as illustrated in FIG. 24. The pressurizing force of the solder ball electrodes 2, which are electrodes to be inspected, against the anisotropically conductive film 10A of the anisotropically conductive connector 10 is relaxed by only the spring elasticity of the leaf spring parts 67.

Figure 25:
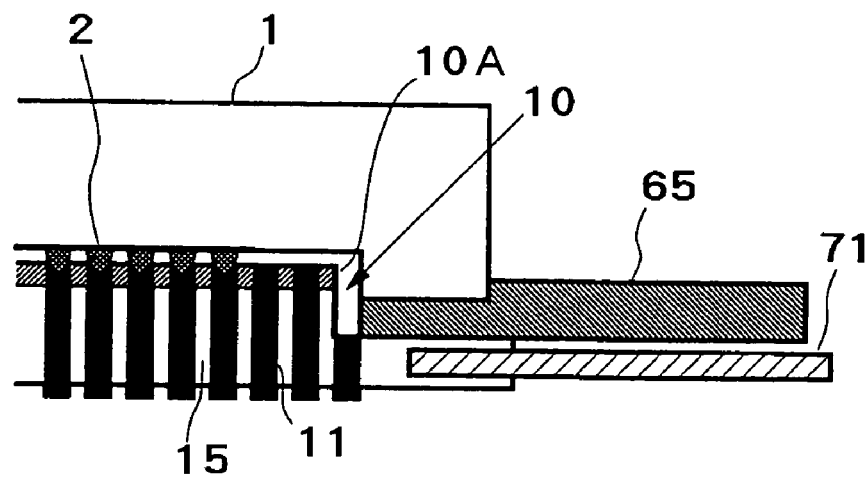
FIG. 25 illustrates the construction of a principal part of a fourth exemplary inspection apparatus equipped with a pressurizing force-relaxing frame.

Further, the pressurizing force-relaxing frame 65 may be that composed of a rubber sheet as illustrated in FIG. 25. According to such construction, the pressurizing force of the solder ball electrodes 2, which are electrodes to be inspected, against the anisotropically conductive film 10A of the anisotropically conductive connector 10 is relaxed by the rubber elasticity of the pressurizing force-relaxing frame 65.

Figure 26:
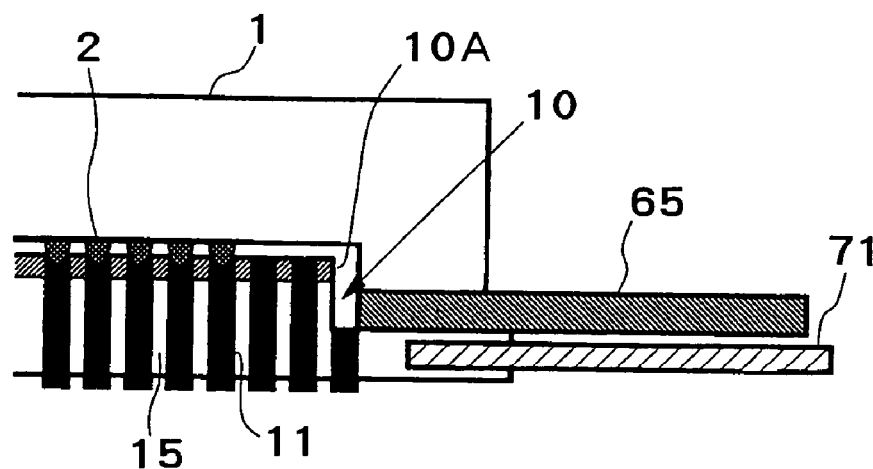
FIG. 26 illustrates the construction of a principal part of a fifth exemplary inspection apparatus equipped with a pressurizing force-relaxing frame.

Further, the pressurizing force-relaxing frame 65 may be that in the form of a plate, which has neither spring elasticity nor rubber elasticity, as illustrated in FIG. 26. According to such construction, the pressurizing force of the solder ball electrodes 2, which are electrodes to be inspected, against the anisotropically conductive film 10A of the anisotropically conductive connector 10 can be controlled by selecting that having a proper thickness as the pressurizing force-relaxing frame 65.

(10) In the inspection apparatus for circuit devices according to the present invention, a sheet-like connector comprising a flexible insulating sheet composed of a resin material and a plurality of metallic electrode structures each extending through in a thickness-wise direction of the sheet and arranged in the insulating sheet may be arranged between the anisotrpically conductive connector 10 and the circuit device 1 which is an inspection target.

According to such construction, electrical connection between the conductive path-forming parts 11 of the anisotropically conductive film 10A and the electrodes to be inspected of the circuit device is achieved through the metallic electrode structures of the sheet-like connector, so that the electrodes to be inspected come into no contact with the conductive path-forming parts 11. Therefore, the migration of the electrode material of the electrodes to be inspected to the conductive particles in the conductive path-forming parts can be surely prevented.

In addition, in the construction having the sheet-like connector, the sheet-like connector can be provided integrally with the anisotropically conductive film 10A in the anisotropically conductive connector 10.

Examples of a process for providing the sheet-like connector integrally with the anisotropically conductive film 10A include a process, in which the sheet-like connector is arranged in a mold upon forming the anisotropically conductive film 10A, and molding material layers are subjected to a curing treatment, and a process, in which the anisotropically conductive film 10A is bonded to the sheet-like connector with an adhesive or the like.

EXAMPLES

The present invention will hereinafter be described specifically by the following examples. However, the present invention is not limited to the following examples.

[Addition Type Liquid Silicone Rubber]

In the following examples and comparative examples, those of a two-liquid type having their corresponding properties shown in the following Table 1 were used as addition type liquid silicone rubber.

TABLE 1

|  | Viscosity (Pa · s) | | Hardened substance | | |
|---|---|---|---|---|---|
|  | Liquid A | Liquid B | Compression set (%) | Durometer hardness | Tear strength (kN/m) |
| Silicone rubber(1) | 180 | 180 | 5 | 23 | 8.5 |
| Silicone rubber(2) | 250 | 250 | 5 | 32 | 25 |
| Silicone rubber(3) | 500 | 500 | 6 | 42 | 30 |
| Silicone rubber(4) | 1,000 | 1,000 | 6 | 52 | 35 |
| Silicone rubber(5) | 600 | 600 | 8 | 60 | 35 |
| Silicone rubber(6) | 60 | 60 | 12 | 13 | 10 |

The properties of the addition type liquid silicone rubber shown in Table 1 were determined in the following manner.
(1) Viscosity of addition type liquid silicone rubber:
  A viscosity at 23±2° C. was measured by a Brookfield viscometer.
(2) Compression set of hardened silicone rubber:
  Solution A and Solution B in addition type liquid silicone rubber of the two-liquid type were stirred and mixed in proportions that their amounts become equal. After this mixture was then poured into a mold and subjected to a defoaming treatment by pressure reduction, a curing treatment was conducted under conditions of 120° C. and 30 minutes, thereby producing a columnar body having a thickness of 12.7 mm and a diameter of 29 mm composed of hardened silicone rubber. The columnar body was post-cured under conditions of 200° C. and 4 hours. The columnar body thus obtained was used as a specimen to measure compression set at 150±2° C. in accordance with JIS K 6249.
(3) Tear strength of hardened silicone rubber:
  A curing treatment and post-curing of addition type liquid silicone rubber were conducted under the same conditions as in the item (2), thereby producing a sheet having a thickness of 2.5 mm. A crescent type specimen was prepared by punching this sheet to measure its tear strength at 23±2° C. in accordance with JIS K 6249.
(4) Durometer hardness of hardened silicone rubber:
  Five sheets produced in the same manner as in the item (3) were stacked on one another, and the resultant laminate was used as a specimen to measure its durometer A hardness at 23±2° C. in accordance with JIS K 6249.

Example 1

(a) Preparation of supporting body and mold:
  A supporting body of a structure shown in FIG. 4 and a mold for molding an anisotropically conductive film of a structure shown in FIG. 6 were prepared in accordance with the following conditions.

[Supporting Body]
  The supporting body (71) is such that its material is SUS304, the thickness is 0.1 mm, the size of an opening (73) is 17 mm×10 mm, and positioning holes (72) are provided at 4 corners.

[Mold]
  Ferromagnetic substance substrates (51, 56) are such that their materials are iron, and the thickness is 6 mm.
  Ferromagnetic substance layers (52, 57) are such that their materials are nickel, the diameter is 0.45 mm (circular), the thickness is 0.1 mm, the arrangement pitch (center distance) is 0.8 mm, and the number of the ferromagnetic substance layers is 288 (12×24).
  Non-magnetic substance layers (53, 58) are such that their materials are dry film resists subjected to a curing treatment, the thickness of portions (53a) in non-magnetic substance layers (53) on the top force (50) is 0.2 mm, the thickness of portions (53b) is 0.1 mm, and the thickness of non-magnetic substance layers (58) on the bottom force (50) is 0.15 mm.
  A molding cavity (59) defined by the mold is 20 mm by 13 mm in dimensions.

(b) Preparation of molding material:
  Sixty parts by weight of conductive particles having an average particle diameter of 30 µm were added to and mixed with 100 parts by weight of addition type liquid silicone rubber (5). Thereafter, the resultant mixture was subjected to a defoaming treatment by pressure reduction, thereby preparing a first molding material. In the above-described process, those (average coating amount: 20% by weight of the weight of core particles) obtained by plating core particles formed of nickel with gold were used as the conductive particles.
  On the other hand, 60 parts by weight of conductive particles having an average particle diameter of 30 µm were added to and mixed with 100 parts by weight of addition type liquid silicone rubber (2). Thereafter, the resultant mixture was subjected to a defoaming treatment by pressure reduction, thereby preparing a second molding material. In the above-described process, those (average coating amount: 20% by weight of the weight of core particles) obtained by plating core particles formed of nickel with gold were used as the conductive particles.

(c) Formation of anisotropically conductive film:
  The first molding material prepared was applied to the molding surface of the top force (50) of the mold by screen printing, thereby forming a first molding material layer (61a) having a thickness of 0.1 mm.
  A spacer (54b) having a thickness of 0.1 mm was arranged in alignment on the molding surface of the bottom force (55) of the mold, the supporting body (71) was arranged in alignment on the spacer (54a), a spacer (54a) having a thickness of 0.1 mm was further arranged in alignment on the supporting body (71), and the second molding material prepared was applied by screen printing, thereby forming a second molding material layer (61b) having a thickness of 0.4 mm in a cavity defined by the bottom force (55), spacers (54a, 54b) and supporting body (71).
  The first molding material layer (61a) formed on the top force (50) was stacked on the second molding material layer (61b) formed on the bottom force (55) in alignment.
  The respective molding material layers formed between the top force (50) and the bottom force (55) were subjected to a curing treatment under conditions of 100° C. and 1 hour while applying a magnetic field of 2 T to portions located between the ferromagnetic substance layers (52, 57) in the thickness-wise direction by electromagnets, thereby forming an anisotropically conductive film (10A).

An anisotropically conductive connector (10) according to the present invention was produced in the above-described manner.

This anisotropically conductive connector will hereinafter be referred to as "Anisotropically Conductive Connector B1".

Example 2

An anisotropically conductive connector was produced in the same manner as in Example 1 except that addition type liquid silicone rubber (4) was used in place of the addition type liquid silicone rubber (5) in the preparation of the first molding material.

This anisotropically conductive connector will hereinafter be referred to as "Anisotropically Conductive Connector B2".

Example 3

An anisotropically conductive connector was produced in the same manner as in Example 1 except that addition type liquid silicone rubber (1) was used in place of the addition type liquid silicone rubber (2) in the preparation of the second molding material.

This anisotropically conductive connector will hereinafter be referred to as "Anisotropically Conductive Connector B3".

Example 4

An anisotropically conductive connector was produced in the same manner as in Example 1 except that addition type liquid silicone rubber (3) was used in place of the addition type liquid silicone rubber (5) in the preparation of the first molding material.

This anisotropically conductive connector will hereinafter be referred to as "Anisotropically Conductive Connector B4".

Example 5

An anisotropically conductive connector was produced in the same manner as in Example 1 except that addition type liquid silicone rubber (3) was used in place of the addition type liquid silicone rubber (2) in the preparation of the second molding material.

This anisotropically conductive connector will hereinafter be referred to as. "Anisotropically Conductive Connector B5".

Comparative Example 1

An anisotropically conductive connector was produced in the same manner as in Example 1 except that addition type liquid silicone rubber (5) was used in place of the addition type liquid silicone rubber (2) in the preparation of the second molding material.

This anisotropically conductive connector will hereinafter be referred to as "Anisotropically Conductive Connector B6".

Comparative Example 2

An anisotropically conductive connector was produced in the same manner as in Example 1 except that addition type liquid silicone rubber (4) was used in place of the addition type liquid silicone rubber (5) in the preparation of the first molding material, and addition type liquid silicone rubber (4) was used in place of the addition type liquid silicone rubber (2) in the preparation of the second molding material.

This anisotropically conductive connector will hereinafter be referred to as "Anisotropically Conductive Connector B 7".

Comparative Example 3

An anisotropically conductive connector was produced in the same manner as in Example 1 except that addition type liquid silicone rubber (1) was used in place of the addition type liquid silicone rubber (5) in the preparation of the first molding material, and addition type liquid silicone rubber (6) was used in place of the addition type liquid silicone rubber (2) in the preparation of the second molding material.

This anisotropically conductive connector will hereinafter be referred to as "Anisotropically Conductive Connector B 8".

Example 6

Sixty parts by weight of conductive particles having an average particle diameter of 30 µm were added to and mixed with 100 parts by weight of addition type liquid silicone rubber (5). Thereafter, the resultant mixture was subjected to a defoaming treatment by pressure reduction, thereby preparing a first molding material. In the above-described process, those (average coating amount: 20% by weight of the weight of core particles) obtained by plating core particles formed of nickel with gold were used as the conductive particles.

Sixty parts by weight of conductive particles having an average particle diameter of 30 µm were added to and mixed with 100 parts by weight of addition type liquid silicone rubber (2). Thereafter, the resultant mixture was subjected to a defoaming treatment by pressure reduction, thereby preparing a second molding material. In the above-described process, those (average coating amount: 20% by weight of the weight of core particles) obtained by plating core particles formed of nickel with gold were used as the conductive particles.

Figure 27:
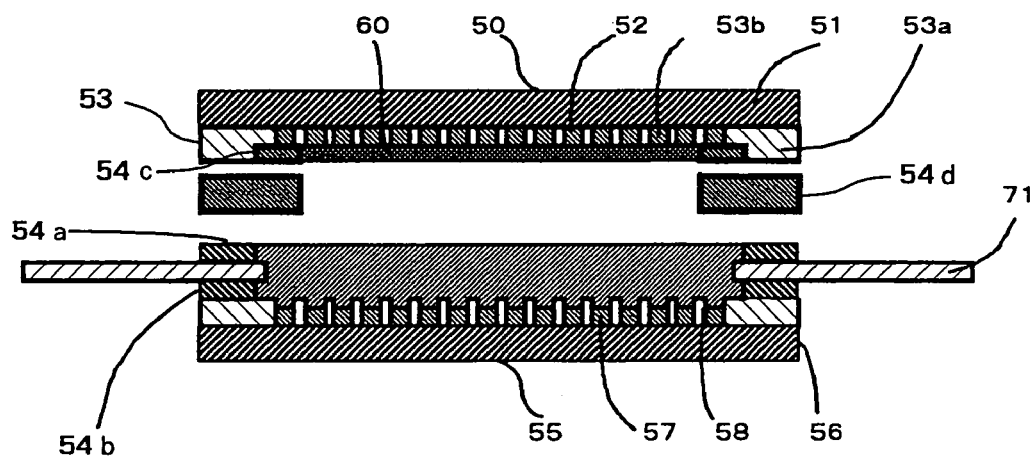
FIG. 27 is a cross-sectional view illustrating a state that in Example 6, a first molding material layer has been formed on the molding surface of a top force, and a second molding material has been applied on to the molding surface of a bottom force.

The mold produced in Example 1 was used, a spacer (54c), which was 13 mm by 13 mm by 0.1 mm in dimensions and had an opening of 9.5 mm by 9.5 mm at its center, was arranged in the recess (60) of the top force (50) as illustrated in FIG. 27, and the first molding material prepared was applied to the surface of the top force (50) by screen printing, thereby forming a first molding material layer (61a) having a thickness of 0.1 mm.

Figure 28:
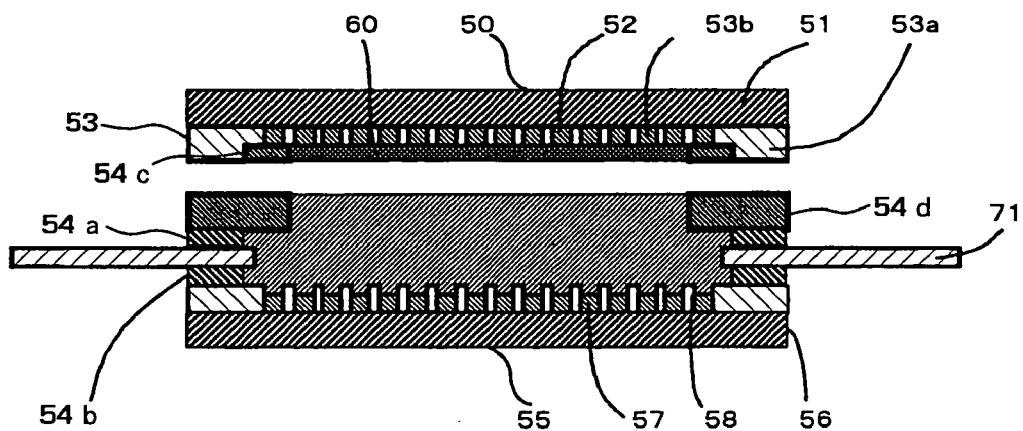
FIG. 28 is a cross-sectional view illustrating a state that in Example 6, a second molding material layer has been formed on the molding surface of a bottom force.

On the other hand, a spacer (54b) having a thickness of 0.1 mm was arranged in alignment on the molding surface of the bottom force (55) of the mold, the supporting body (71) was arranged in alignment on the spacer (54a), a spacer (54a) having a thickness of 0.1 mm was further arranged in alignment on the supporting body (71), and the second molding material prepared was applied by screen printing, thereby charging the second molding material into a cavity defined by the bottom force (55), spacers (54a, 54b) and supporting body (71). As illustrated in FIG. 28, a spacer (54d), which was 18 mm by 18 mm by 5 mm in dimensions and had an opening of 9.5 mm by 9.5 mm at its center, was further arranged on the spacer (54a), and the second molding material was charged into the opening of the spacer (54d) by screen printing, thereby forming a second molding material layer (61b) having a maximum thickness of 0.85 mm.

The first molding material layer (61a) formed on the top force (50) was stacked on the second molding material layer (61b) formed on the bottom force (55) in alignment. The respective molding material layers formed between the top force (50) and the bottom force (55) were subjected to a curing treatment under conditions of 100° C. and 1 hour while applying a magnetic field of 2 T to portions located between the ferromagnetic substance layers (52, 57) in the thickness-wise direction by electromagnets, thereby forming an anisotropically conductive film (10A).

An anisotropically conductive connector (10) according to the present invention was produced in the above-described manner.

This anisotropically conductive connector will hereinafter be referred to as "Anisotropically Conductive Connector C1".

Example 7

An anisotropically conductive connector was produced in the same manner as in Example 6 except that 30 parts by weight of diamond powder having an average particle diameter of 16.2 μm was added together with the conductive particles to the addition type liquid silicone rubber (5) in the preparation of the first molding material.

This anisotropically conductive connector will hereinafter be referred to as "Anisotropically Conductive Connector C2".

Example 8

An anisotropically conductive connector was produced in the same manner as in Example 6 except that addition type liquid silicone rubber (3) was used in place of the addition type liquid silicone rubber (5) in the preparation of the first molding material.

This anisotropically conductive connector will hereinafter be referred to as "Anisotropically Conductive Connector C3".

Example 9

An anisotropically conductive connector was produced in the same manner as in Example 6 except that addition type liquid silicone rubber (3) was used in place of the addition type liquid silicone rubber (5) in the preparation of the first molding material, and 30 parts by weight of diamond powder having an average particle diameter of 16.2 μm was added together with the conductive particles to the addition type liquid silicone rubber (3).

This anisotropically conductive connector will hereinafter be referred to as "Anisotropically Conductive Connector C4".

Comparative Example 4

An anisotropically conductive connector was produced in the same manner as in Example 6 except that addition type liquid silicone rubber (1) was used in place of the addition type liquid silicone rubber (5) in the preparation of the first molding material, and addition type liquid silicone rubber (6) was used in place of the addition type liquid silicone rubber (2) in the preparation of the second molding material.

This anisotropically conductive connector will hereinafter be referred to as "Anisotropically Conductive Connector C5".

Comparative Example 5

An anisotropically conductive connector was produced in the same manner as in Example 6 except that addition type liquid silicone rubber (1) was used in place of the addition type liquid silicone rubber (5) in the preparation of the first molding material, 30 parts by weight of diamond powder having an average particle diameter of 16.2 pm was added together with the conductive particles to this addition type liquid silicone rubber (1), and addition type liquid silicone rubber (6) was used in place of the addition type liquid silicone rubber (2) in the preparation of the second molding material.

This anisotropically conductive connector will hereinafter be referred to as "Anisotropically Conductive Connector C6".

[Evaluation of Anisotropically Conductive Connector]

With respect to each of the anisotropically conductive connectors according to Examples 1 to 9 and Comparative Examples 1 to 5, its performance was evaluated in the following manner.

Figure 29:
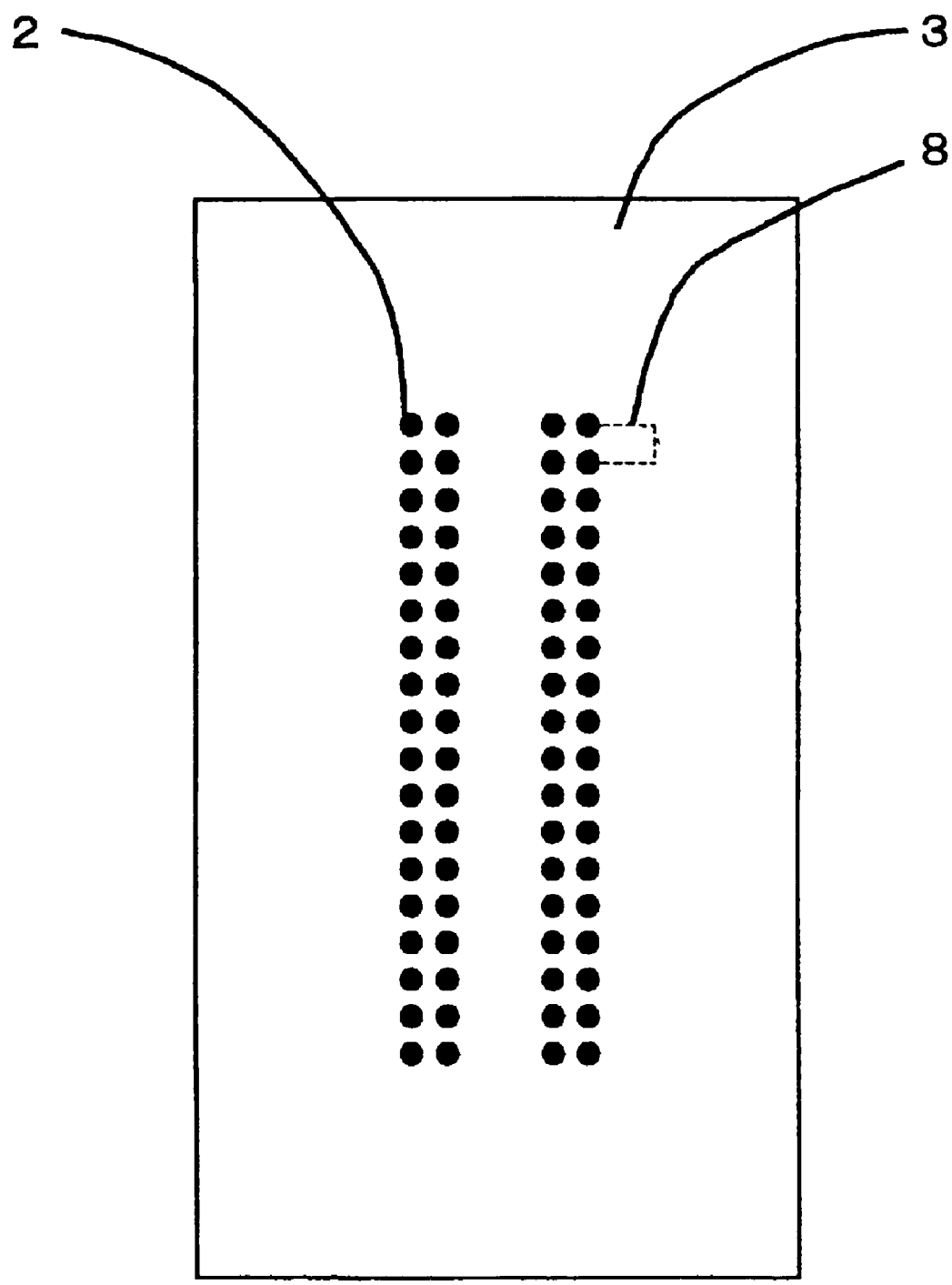
FIG. 29 is a plan view of a circuit device for test used in Examples.
Figure 30:
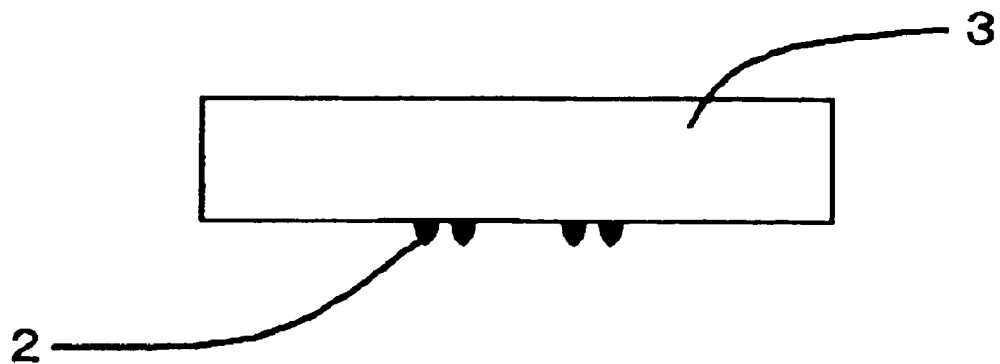
FIG. 30 is a side elevation of a circuit device for test used in Examples.

Such a circuit device 3 for test as illustrated in FIGS. 29 and 30 was provided for evaluating Anisotropically Conductive Connectors B1 to B8 according to Examples 1 to 5 and Comparative Examples 1 to 3.

This circuit device 3 for test had 72 solder ball electrodes 2 (material: 64 solder) in total, each of which had a diameter of 0.4 mm and a height of 0.3 mm. In this circuit device, 2 electrode groups each composed of 36 solder ball electrodes 2 arranged were formed. In each electrode group, two lines in total of a line of 18 solder ball electrodes 2 aligned on a straight line at a pitch of 0.8 mm, were formed. Each two of these solder ball electrodes were electrically connected to each other by a wiring 8 within the circuit device 3. The number of wirings within the circuit device 3 was 36 in total.

Figure 31:
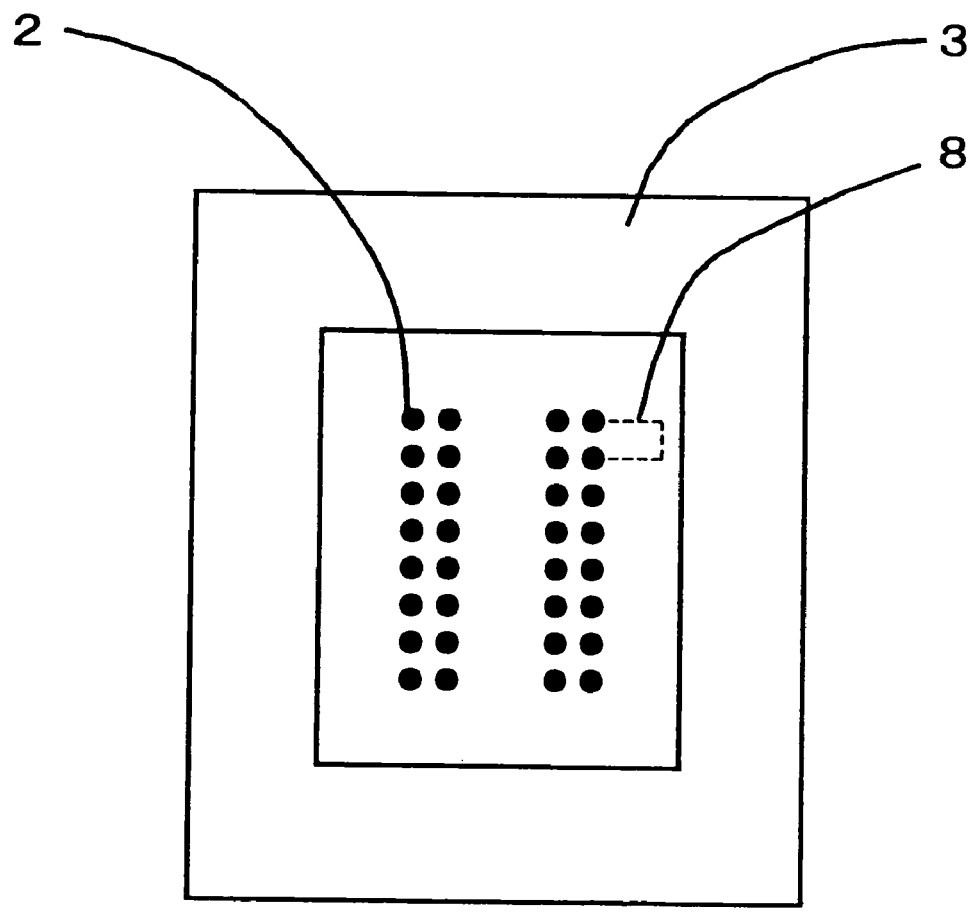
FIG. 31 is a plan view of another circuit device for test used in Examples.
Figure 32:
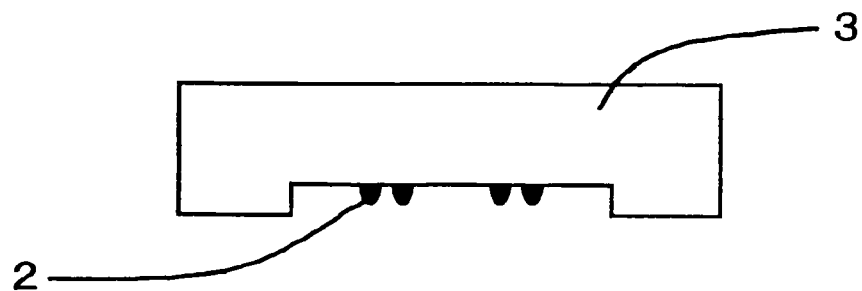
FIG. 32 is a side elevation of another circuit device for test used in Examples.

Such a circuit device 3 for test as illustrated in FIGS. 31 and 32 was provided for evaluating Anisotropically Conductive Connectors C1 to C6 according to Examples 6 to 9 and Comparative Examples 4 and 5.

This circuit device 3 for test had 32 solder ball electrodes 2 (material: 64 solder) in total, each of which had a diameter of 0.4 mm and a height of 0.3 mm. In this circuit device, 2 electrode groups each composed of 16 solder ball electrodes 2 arranged were formed. In each electrode group, two lines in total of a line of 8 solder ball electrodes 2 aligned on a straight line at a pitch of 0.8 mm, were formed. Each two of these solder ball electrodes were electrically connected to each other by a wiring 8 within the circuit device 3. The number of wirings within the circuit device 3 was 16 in total.

The circuit devices for test were respectively used to make evaluation as to the anisotropically conductive connectors according to Examples 1 to 9 and Comparative Examples 1 to 5 as in the following manner.

<<Repetitive Durability>>

Figure 33:
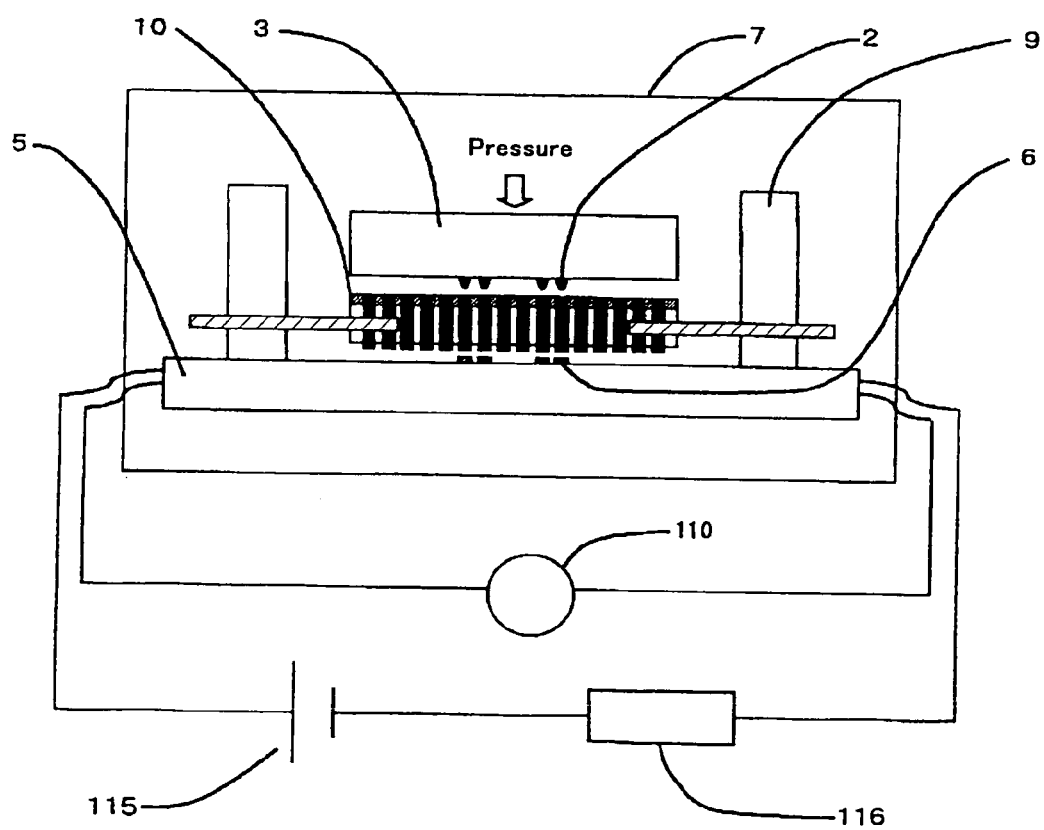
FIG. 33 schematically illustrates the construction of a testing apparatus for repetitive durability used in Examples.

The anisotropically conductive connector 10 was arranged in alignment on the circuit board 5 for inspection by inserting the guide pins 9 of the circuit board 5 for inspection into the positioning holes of the supporting body 71 in the anisotropically conductive connector 10 as illustrated in FIG. 33. The circuit device 3 for test was arranged on this anisotropically conductive connector 10. These were fixed by a pressurizing jig (not illustrated) and arranged within a thermostatic chamber 7 in this state.

The temperature within the thermostatic chamber 7 was set to 100° C., and a DC current of 10 mA was applied constantly by means of a DC power source 115 and a constant-current controller 116 between external terminals (not illustrated) of the circuit board 5 for inspection, which were electrically connected to each other through the anisotropically conductive connector 10, the circuit device 3 for test, and the inspection electrodes 6 of the circuit board 5 for inspection and wirings (not illustrated) thereof while repeating pressurization at a pressurizing cycle of 5 sec/stroke by the pressuring jig in such a manner that a distortion factor of the conductive path-forming parts 11 of the anisotropically conductive film 10A in the anisotropically conductive connector 10 is 30% (thickness of the conductive path-forming parts upon pressurization: 0.35 mm), thereby measuring voltage between the external terminals of the circuit board 5 for inspection upon the pressurization by a voltmeter 110.

Supposing that a voltage value (V) measured is $V_1$, and the DC current applied is $I_1$ (=10 mA), an electric resistance value $R_1$ was determined in accordance with the following expression.

$R_1 = V_1/I_1$

The electric resistance value $R_1$ includes an electric resistance value between the electrodes of the circuit device 3 for test and an electric resistance value between the external terminals of the circuit board for inspection in addition to an electric resistance value between 2 conductive path-forming parts.

Since electrical connection of the circuit device became difficult in fact when the electric resistance value $R_1$ was higher than 2 Ω, the measurement of voltage was continued until the electric resistance value $R_1$ was higher than 2 Ω. However, the pressuring operation was conducted 100,000 times in total. The results are shown in Table 2.

With respect to the anisotropically conductive connectors according to Examples 6 to 9 and Comparative Examples 4 and 5, an electric resistance value $R_1$ was determined in the same manner as described above except that a pressurizing force-relaxing frame of the construction shown in FIG. 20, which had been produced in accordance with the following conditions, was arranged between the anisotropically conductive connector and the circuit device for test. The results are shown in Table 2.

The pressurizing force-relaxing frame was in the form of a rectangular plate of 24 mm by 30 mm by 1 mm in dimensions, and had an opening (73) of 20 mm by 20 mm in dimensions, leaf spring parts (67) of 5 mm by 9 mm by 1 mm in dimensions, the projected height of the free tip end of each of said leaf spring parts (67) being 3 mm, and positioning holes (72) at its 4 corners.

After completion of these tests, the deformed condition of the conductive path-forming parts and the migrated conditions of the electrode material to the conductive particles as to each anisotropically conductive connector were evaluated in accordance with the following respective standards. The results are shown in Table 3. Deformed condition of conductive path-forming parts:

The surfaces of the conductive path-forming parts were observed visually to rank as ○ where deformation was scarcely caused, as Δ where little deformation was observed, or x where great deformation was observed. Migrated condition of electrode material to conductive particles:

The color of the conductive particles in the conductive path-forming parts was observed visually to rank as ○ where discoloration was scarcely caused, as Δ where the color was slightly changed to gray, or x where the color was almost changed to gray or black.

<<Adhesive Property to Circuit Device>>

One hundred each of the anisotropically conductive connectors according to Examples 1 to 9 and Comparative Examples 1 to 5 were provided. With respect to these anisotropically conductive connectors, a pressurizing test was conducted in the same manner as in the repetitive durability test. Thereafter, the adhered condition of the anisotropically conductive film to the circuit device for test was observed to rank as ○ where the number of adhered films was less than 30%, as Δ where the number was 30 to 70%, or x where the number exceeds 70%. The results are shown in Table 3.

TABLE 2

| | Presence and absence of pressurinzing force relaxing-frame | Durometer hardness | | | Electric resistance value $R_1$ (Ω) | | | | | | |
|---|---|---|---|---|---|---|---|---|---|---|---|
| | | $H_1$ | $H_2$ | $H_1/H_2$ | Pressurized 3000 times | Pressurized 5000 times | Pressurized 10000 times | Pressurized 30000 times | Pressurized 50000 times | Pressurized 70000 times | Pressurized 100000 times |
| Example 1 | Absent | 60 | 32 | 1.9 | <0.5 | <1 | <1.5 | <1.5 | <2 | >2 | — |
| Example 2 | Absent | 52 | 32 | 1.6 | <1 | <1 | <1.5 | <1.5 | <2 | >2 | — |
| Example 3 | Absent | 60 | 23 | 2.6 | <0.5 | <1 | <1.5 | <2 | >2 | — | — |
| Example 4 | Absent | 42 | 32 | 1.3 | <1 | <1 | <1.5 | <2 | >2 | — | — |
| Example 5 | Absent | 60 | 42 | 1.4 | <1 | <1.5 | <1.5 | <2 | >2 | — | — |
| Comparative example 1 | Absent | 60 | 60 | 1.0 | <2 | >2 | — | — | — | — | — |
| Comparative example 2 | Absent | 52 | 52 | 1.0 | >2 | — | — | — | — | — | — |
| Comparative example 3 | Absent | 23 | 13 | 1.8 | >2 | — | — | — | — | — | — |
| Example 6 | Absent | 60 | 32 | 1.9 | <0.5 | <0.5 | <0.5 | <1 | <2 | >2 | — |
| | Present | 60 | 32 | 1.9 | <0.5 | <0.5 | <0.5 | <0.5 | <1 | <1.5 | <2 |

TABLE 2-continued

| | Presence and absence of pressurinzing force relaxing-frame | Durometer hardness | | | Electric resistance value $R_1$ ($\Omega$) | | | | | | |
|---|---|---|---|---|---|---|---|---|---|---|---|
| | | $H_1$ | $H_2$ | $H_1/H_2$ | Pressurized 3000 times | Pressurized 5000 times | Pressurized 10000 times | Pressurized 30000 times | Pressurized 50000 times | Pressurized 70000 times | Pressurized 100000 times |
| Example 7 | Absent | 60 | 32 | 1.9 | <0.5 | <0.5 | <0.5 | <0.5 | <1 | <1.5 | <2 |
| | Present | 60 | 32 | 1.9 | <0.5 | <0.5 | <0.5 | <0.5 | <0.5 | <1 | <1.5 |
| Example 8 | Absent | 42 | 32 | 1.3 | <0.5 | <0.5 | <0.5 | <1.5 | >2 | — | — |
| | Present | 42 | 32 | 1.3 | <0.5 | <0.5 | <0.5 | <1 | <1.5 | <1.5 | >2 |
| Example 9 | Absent | 42 | 32 | 1.3 | <0.5 | <0.5 | <0.5 | <1 | <1.5 | >2 | — |
| | Present | 42 | 32 | 1.3 | <0.5 | <0.5 | <0.5 | <1 | <1 | <1.5 | >2 |
| Comparative examble 4 | Absent | 23 | 13 | 1.8 | >2 | — | — | — | — | — | — |
| | Present | 23 | 13 | 1.8 | <1 | >2 | — | — | — | — | — |
| Comparative example 5 | Absent | 23 | 13 | 1.8 | <1.5 | >2 | — | — | — | — | — |
| | Present | 23 | 13 | 1.8 | <0.5 | <1 | >2 | — | — | — | — |

TABLE 3

| | Presence and absence of pressurizing force relaxing-frame | Deformed condition of conductive path-forming parts | Migrated condition of electrode material to conductive particles | Adhesive property to circuit device |
|---|---|---|---|---|
| Example 1 | Absent | Δ | Δ | Δ |
| Example 2 | Absent | Δ | Δ | Δ |
| Example 3 | Absent | Δ | Δ | Δ |
| Example 4 | Absent | Δ | Δ | Δ |
| Example 5 | Absent | Δ | Δ | Δ |
| Comparative example 1 | Absent | Δ | X | Δ |
| Comparative example 2 | Absent | Δ | X | Δ |
| Comparative example 3 | Absent | X | Δ | X |
| Example 6 | Absent | Δ | Δ | Δ |
| | Present | ○ | Δ | ○ |
| Example 7 | Absent | ○ | ○ | ○ |
| | Present | ○ | ○ | ○ |
| Example 8 | Absent | Δ | Δ | Δ |
| | Present | ○ | Δ | ○ |
| Example 9 | Absent | ○ | ○ | ○ |
| | Present | ○ | ○ | ○ |
| Comparative example 4 | Absent | X | X | X |
| | Present | X | X | ○ |
| Comparative example 5 | Absent | X | ○ | X |
| | Present | Δ | ○ | ○ |

EFFECTS OF THE INVENTION

According to the anisotropically conductive connectors of the present invention, the durometer hardness of the elastic polymeric substance forming one elastic layer of the elastic layers forming the surfaces of the anisotropically conductive film is at least 30, so that the anisotropically conductive sheet can be prevented from causing permanent deformation by the contact of the target electrodes to be connected with pressure and deformation by abrasion even if the target electrodes to be connected under pressure are those projected. In addition, since the durometer hardness of the elastic polymeric substance forming the other elastic layer is sufficiently lower than that of the elastic polymeric substance forming said one elastic layer, necessary conductivity can be surely achieved by pressurizing the conductive path-forming parts. Accordingly, stable conductivity can be achieved over a long period of time even when the conductive path-forming parts are pressed repeatedly by the target electrodes to be connected.

Since said one elastic layer contains the particles exhibiting neither conductivity nor magnetism, whereby the hardness of said one elastic layer is increased. Therefore, occurrence of the permanent deformation by the pressure contact of the target electrodes to be connected with pressure and deformation by abrasion can be more inhibited, and moreover the migration of the electrode material to the conductive particles in the anisotropically conductive film is prevented or inhibited, so that more stable conductivity can be achieved over a long period of time, and the anisotropically conductive sheet can be prevented or inhibited from adhering to a circuit device even when it is used in a state brought into contact under pressure with the circuit device under a high-temperature environment.

According to the production process of the anisotropically conductive connector of the present invention, the molding material layer formed on the molding surface of one force is stacked on the molding material layer formed on the molding surface of the other force, and the respective molding material layers are subjected to a curing treatment in this state, so that an anisotropically conductive connector having a anisotropically conductive film composed of at least 2 elastic layers that are different in hardness from each other and integrally laminated on each other can be advantageously and surely produced.

According to the inspection apparatus for circuit devices of the present invention, the apparatus is equipped with the anisotropically conductive connector of the above, so that occurrence of permanent deformation by the contact of electrodes to be inspected with pressure and deformation by abrasion is inhibited even if the electrodes to be inspected are those projected, and so stable conductivity can be achieved over a long period of time even when inspection is conducted continuously as to a great number of circuit devices.

According to the inspection apparatus of the present invention, electrical inspection of a circuit device can be conducted without using any sheet-like connector, in addition to the anisotropically conductive connector. When no sheet-like connector is used, positioning between the anisotropically conductive connector and the sheet-like connector is unnecessary, so that the problem of positional deviation between the sheet-like connector and the anisotropically conductive connector due to temperature change can be avoided, and moreover the constitution of the inspection apparatus becomes easy.

The pressurizing force-relaxing frame is provided between a circuit device, which is an inspection target, and the anisotropically conductive connector, whereby the pressurizing force of the electrodes to be inspected against the anisotropically conductive film of the anisotropically conductive connector is relaxed, so that stable conductivity can be achieved over a longer period of time.

A frame having spring elasticity or rubber elasticity is used as the pressurizing force-relaxing frame, whereby the intensity of shock applied to the anisotropically conductive film by the electrodes to be inspected can be reduced. Therefore, breaking or any other trouble of the anisotropically conductive film can be prevented or inhibited, and the circuit device can be easily separated from the anisotropically conductive film by the spring elasticity of the pressurizing force-relaxing frame when the pressurizing force against the anisotropically conductive film is released, so that the work of changing the circuit device after completion of the inspection to an uninspected circuit device can be smoothly conducted. As a result, inspection efficiency of circuit devices can be improved.

The invention claimed is:

1. An anisotropically conductive connector comprising an anisotropically conductive film, in which a plurality of conductive path-forming parts each extending in a thickness-wise direction of the film are arranged in a state mutually insulated by insulating parts, wherein the anisotropically conductive film is composed by laminating integrally at least two elastic layers, each formed of an insulating elastic polymeric substance, and conductive particles exhibiting magnetism are contained in portions of the respective elastic layers, at which conductive path-forming parts are formed, and the anisotropically conductive film satisfies the following Condition (1) and Condition (2):

$$30 \leq H_1 \leq 70 \qquad \text{Condition (1)}$$

$$H_1/H_2 \leq 1.1 \qquad \text{Condition (2)}$$

wherein $H_1$ is a durometer hardness of an elastic polymeric substance forming one elastic layer of elastic layers forming the surfaces of the anisotropically conductive film, and $H_2$ is a durometer hardness of an elastic polymeric substance forming the other elastic layers, wherein each of the conductive path-forming parts has a columnar shape and extends through the anisotropically conductive film composed of the laminated elastic layers, wherein the anisotropically conductive connector is the anisotropically conductive connector for conducting electrical connection between electrodes to be inspected of a circuit device, which is an inspection target, and inspection electrodes of a circuit board for inspection by being intervened between the circuit device and the circuit board for inspection, wherein the durometer hardness of the elastic polymeric substance forming the elastic layer coming into contact with the circuit device, in the anisotropically conductive film satisfies $H_1$ in the Condition (1) and Condition (2).

2. The anisotropically conductive connector according to claim 1, wherein the following Condition (3) is satisfied:

$$15 \leq H_2 \leq 55 \qquad \text{Condition (3)}.$$

3. The anisotropically conductive connector according to claim 1, wherein a supporting body for supporting the peripheral edge portion of the anisotropically conductive film is provided.

4. The anisotropically conductive connector according to claim 1, wherein the elastic layer coming into contact with the electrodes to be inspected, in the anisotropically conductive film contains particles exhibiting neither conductivity nor magnetism.

5. The anisotropically conductive connector according to claim 4, wherein the particles exhibiting neither conductivity nor magnetism are diamond powder.

6. The anisotropically conductive connector according to claim 3, wherein conductive path-forming parts, which are not electrically connected to the electrodes to be inspected of the circuit device that is an inspection target, are formed in the anisotropically conductive film in addition to the conductive path-forming parts to be electrically connected to the electrodes to be inspected.

7. The anisotropically conductive connector according claim 6, wherein the conductive path-forming parts, which are not electrically connected to the electrodes to be inspected of the circuit device that is an inspection target, are formed in at least the peripheral edge portion of the anisotropically conductive film supported by the supporting body.

8. The anisotropically conductive connector according to claim 6, wherein the conductive path-forming parts are arranged at a fixed pitch.

9. An inspection apparatus for circuit devices, comprising a circuit board for inspection having inspection electrodes arranged correspondingly to electrodes to be inspected of a circuit device, which is an inspection target, and the anisotropically conductive connector according to claim 3 arranged on the circuit board for inspection.

10. The inspection apparatus for circuit devices according to claim 9, wherein a pressurizing force-relaxing frame for relaxing the pressurizing force of the electrodes to be inspected against the anisotropically conductive film of the anisotropically conductive connector is arranged between the circuit device, which is an inspection target, and the anisotropically conductive connector.

11. The inspection apparatus for circuit devices according to claim 10, wherein the pressurizing force-relaxing frame has spring elasticity or rubber elasticity.

12. The anisotropically conductive connector according to claim 1 wherein a reinforcing material is contained in at least one of the respective elastic layers forming the anisotropically conductive film.

13. The anisotropically conductive connector according to claim 1, wherein, in the anisotropically conductive film, an intermediate elastic layer is formed between one elastic layer and the other elastic layer, which form the surfaces of the anisotropically conductive film respectively, and a reinforcing material is contained in at least one of the one elastic layer, the other elastic layer and the intermediate layer.

14. The anisotropically conductive connector according to claim 12, wherein, the reinforcing material is formed of mesh or nonwoven fabric.

15. The anisotropically conductive connector according to claim 14, wherein, the mesh or nonwoven fabric is formed by organic fiber.

16. The anisotropically conductive connector according to claim 15, wherein the organic fiber have a coefficient of liner thermal expansion of $30\times10^{-6}$ to $-5\times10^{-6}$/K.

17. An inspection apparatus for circuit devices, comprising, a circuit board for inspection having inspection electrodes arranged correspondingly to electrodes to be inspected of a circuit device, which is an inspection target, and the anisotropyically conductive connector according to claim 12 arranged on the circuit board for inspection.

18. A process for producing an anisotropically conductive connector having an anisotropically conductive film, in which a plurality of conductive path-forming parts each extending in a thickness-wise direction of the film are arranged in a state mutually insulated by insulating parts, which comprises:

providing a mold for forming the anisotropically conductive film, the molding cavity of which is formed by a pair of mold sections, forming a molding material layer in the form of paste with conductive particles exhibiting magnetism contained in a polymeric substance-forming material on a molding surface of one mold section, and forming at least one molding material layer in the form of paste with conductive particles contained in a polymeric substance-forming material on a molding surface of the other mold section, stacking the molding material layer formed on the molding surface of said one mold section on the molding material layer formed on the molding surface of the other mold section, then applying a magnetic field having an intensity distribution to the thickness-wise directions of the respective molding material layers, and subjecting the molding material layers to a curing treatment, thereby forming the anisotropically conductive film, wherein the anisotropically conductive film satisfies the following Condition (1) and Condition (2):

$H_1 \geq 30$  Condition (1)

$H_1/H_2 \geq 1.1$  Condition (2)

wherein $H_1$ is a durometer hardness of an elastic polymeric substance obtained by curing the polymeric substance-forming material in the molding material layer formed on the molding surface of said one mold section, and $H_2$ is a durometer hardness of an elastic polymeric substance obtained by curing the polymeric substance-forming material in the molding material layer formed on the molding surface of the other mold section.

* * * * *